(12) United States Patent
Lin et al.

(10) Patent No.: US 12,349,379 B2
(45) Date of Patent: Jul. 1, 2025

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Zhi-Chang Lin, Zhubei (TW);
Shih-Cheng Chen, New Taipei (TW);
Lo-Heng Chang, Hsinchu (TW);
Jung-Hung Chang, Yuanlin (TW);
Kuo-Cheng Chiang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 227 days.

(21) Appl. No.: 17/881,866

(22) Filed: Aug. 5, 2022

(65) Prior Publication Data

US 2022/0384619 A1 Dec. 1, 2022

Related U.S. Application Data

(62) Division of application No. 16/872,058, filed on May 11, 2020, now Pat. No. 11,450,754.

(Continued)

(51) Int. Cl.
*H10D 30/62* (2025.01)
*H10D 30/01* (2025.01)
(Continued)

(52) U.S. Cl.
CPC ......... *H10D 30/024* (2025.01); *H10D 30/014* (2025.01); *H10D 30/62* (2025.01); *H10D 30/6219* (2025.01); *H10D 30/6735* (2025.01); *H10D 84/0151* (2025.01); *H10D 84/0158* (2025.01); *H10D 84/038* (2025.01); *H10D 64/018* (2025.01)

(58) Field of Classification Search
CPC ......... H01L 29/66553; H01L 29/42392; H01L 29/66439; H01L 21/823418; H01L 21/823481; H01L 29/0649
See application file for complete search history.

(56) References Cited

U.S. PATENT DOCUMENTS 9,209,247 B2  12/2015  Colinge et al.
9,236,267 B2   1/2016  De et al.
(Continued)

FOREIGN PATENT DOCUMENTS

TW   201909425 A   3/2019

*Primary Examiner* — Tuan A Hoang
(74) *Attorney, Agent, or Firm* — Slater Matsil, LLP

(57) ABSTRACT

Semiconductor devices using a dielectric structure and methods of manufacturing are described herein. The semiconductor devices are directed towards gate-all-around (GAA) devices that are formed over a substrate and are isolated from one another by the dielectric structure. The dielectric structure is formed over the fin between two GAA devices and cuts a gate electrode that is formed over the fin into two separate gate electrodes. The two GAA devices are also formed with bottom spacers underlying source/drain regions of the GAA devices. The bottom spacers isolate the source/drain regions from the substrate. The dielectric structure is formed with a shallow bottom that is located above the bottoms of the bottom spacers.

20 Claims, 17 Drawing Sheets

X-cut

Related U.S. Application Data

(60) Provisional application No. 62/927,582, filed on Oct. 29, 2019.

(51) Int. Cl.
    *H10D 30/67*     (2025.01)
    *H10D 84/01*     (2025.01)
    *H10D 84/03*     (2025.01)
    H10D 64/01     (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,899,267 B1 * | 2/2018 | Liou .................... H10D 84/038 |
| 10,446,664 B1 | 10/2019 | Cheng et al. |
| 2011/0233522 A1 | 9/2011 | Cohen et al. |
| 2016/0111336 A1 * | 4/2016 | Chang .................... H10D 30/62 438/430 |
| 2018/0315828 A1 * | 11/2018 | Yamashita ........ H01L 29/66545 |
| 2020/0006559 A1 * | 1/2020 | Mehandru .............. H10D 84/83 |
| 2020/0052124 A1 * | 2/2020 | Miao .................... H10D 64/017 |

* cited by examiner

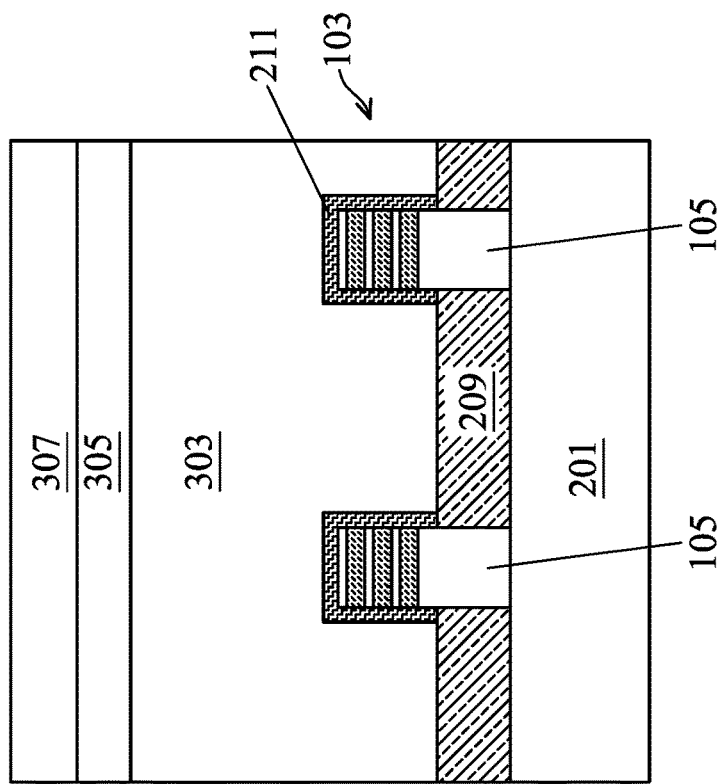
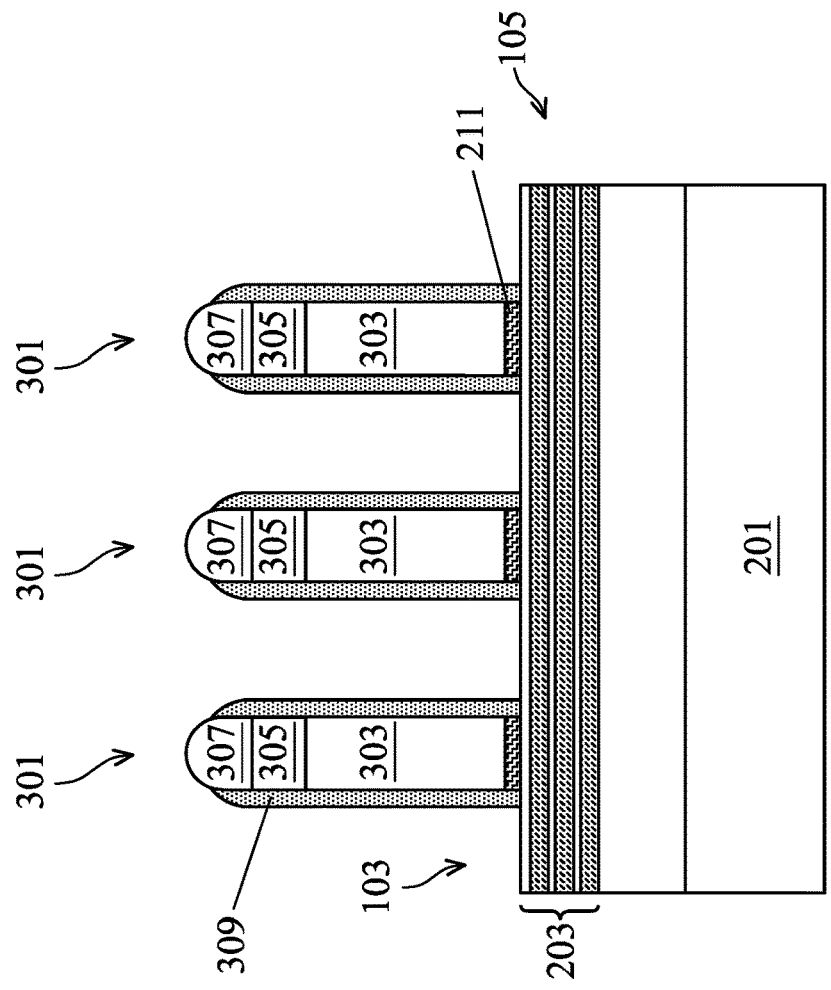
Figure 3B Y-cut
Figure 3A X-cut

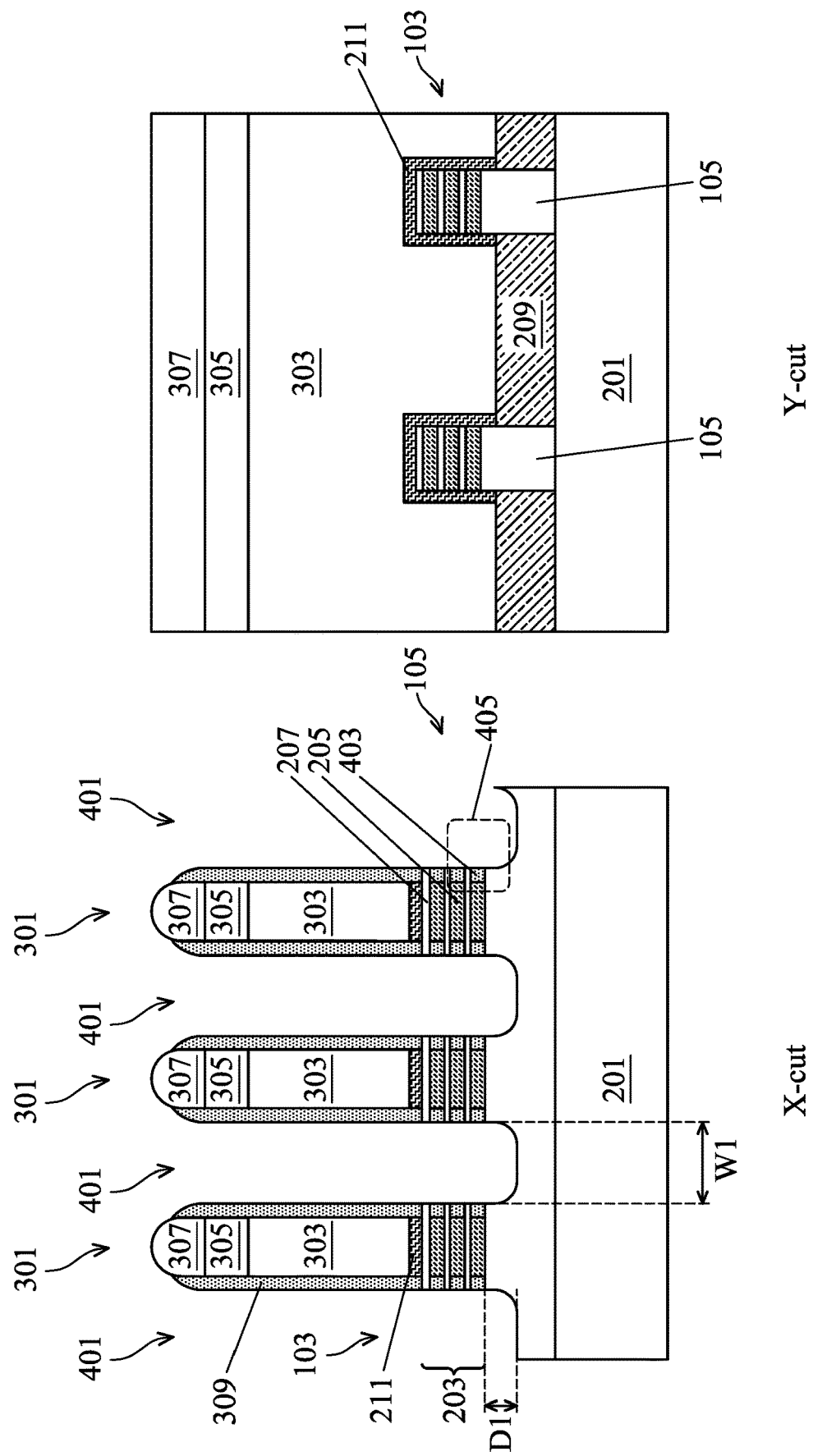
Figure 4B  Y-cut
Figure 4A  X-cut

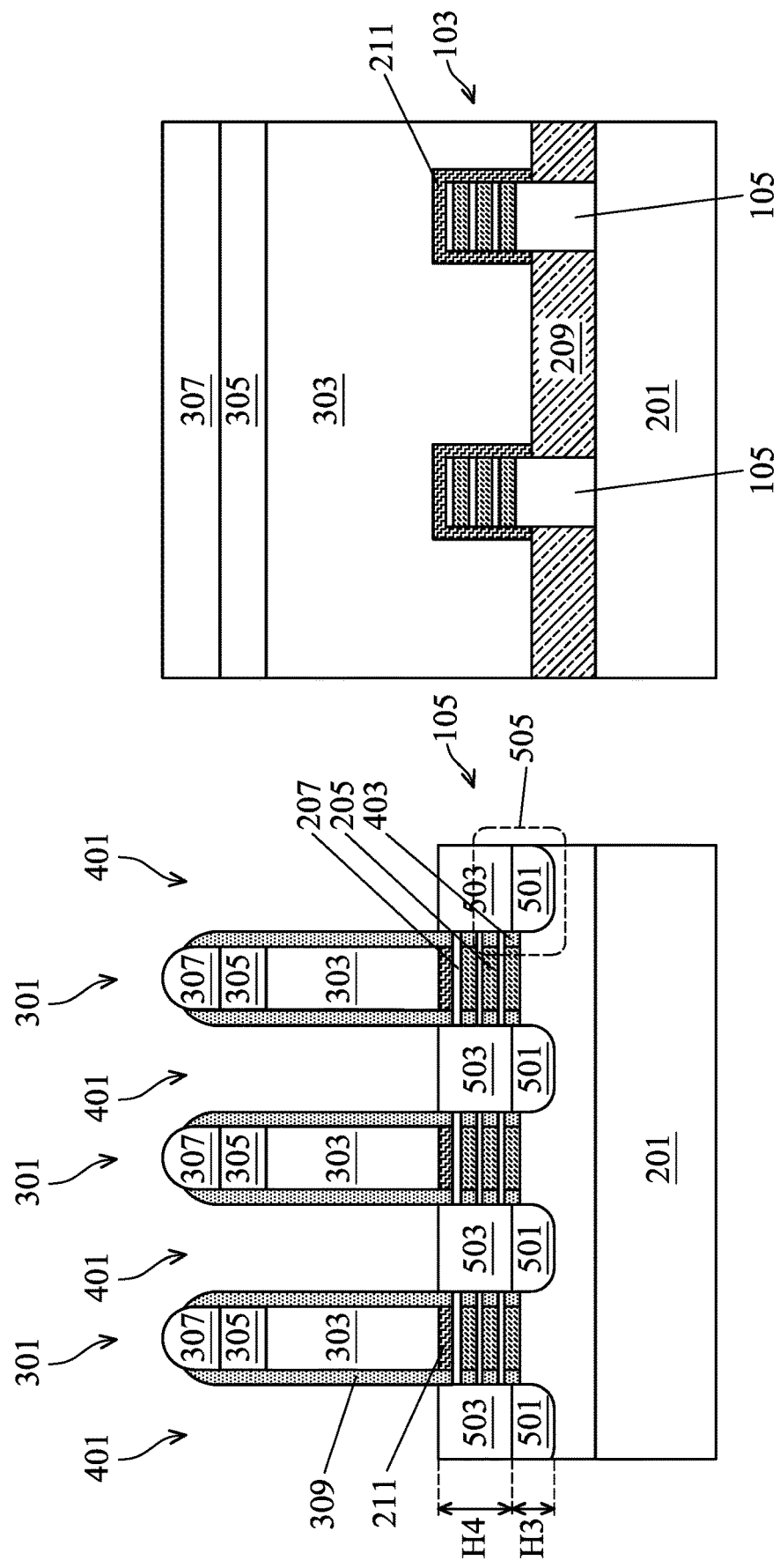
Figure 5B Y-cut
Figure 5A X-cut

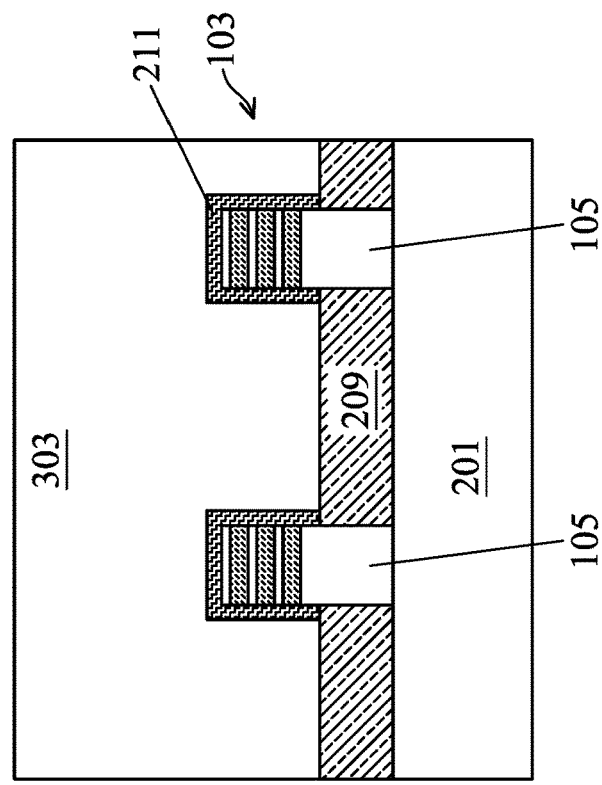
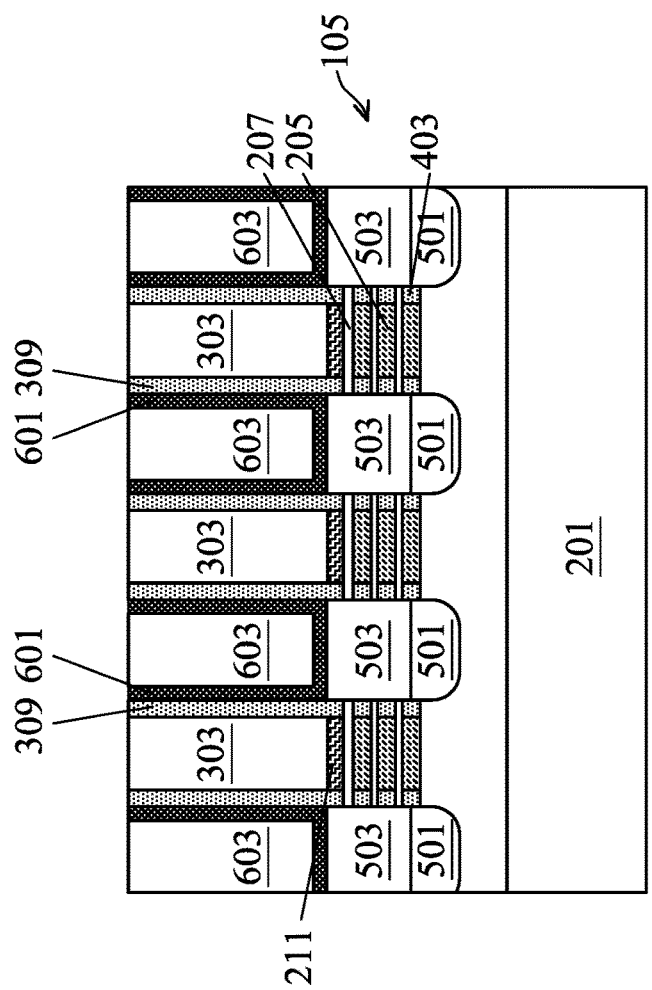
Figure 6B
Figure 6A

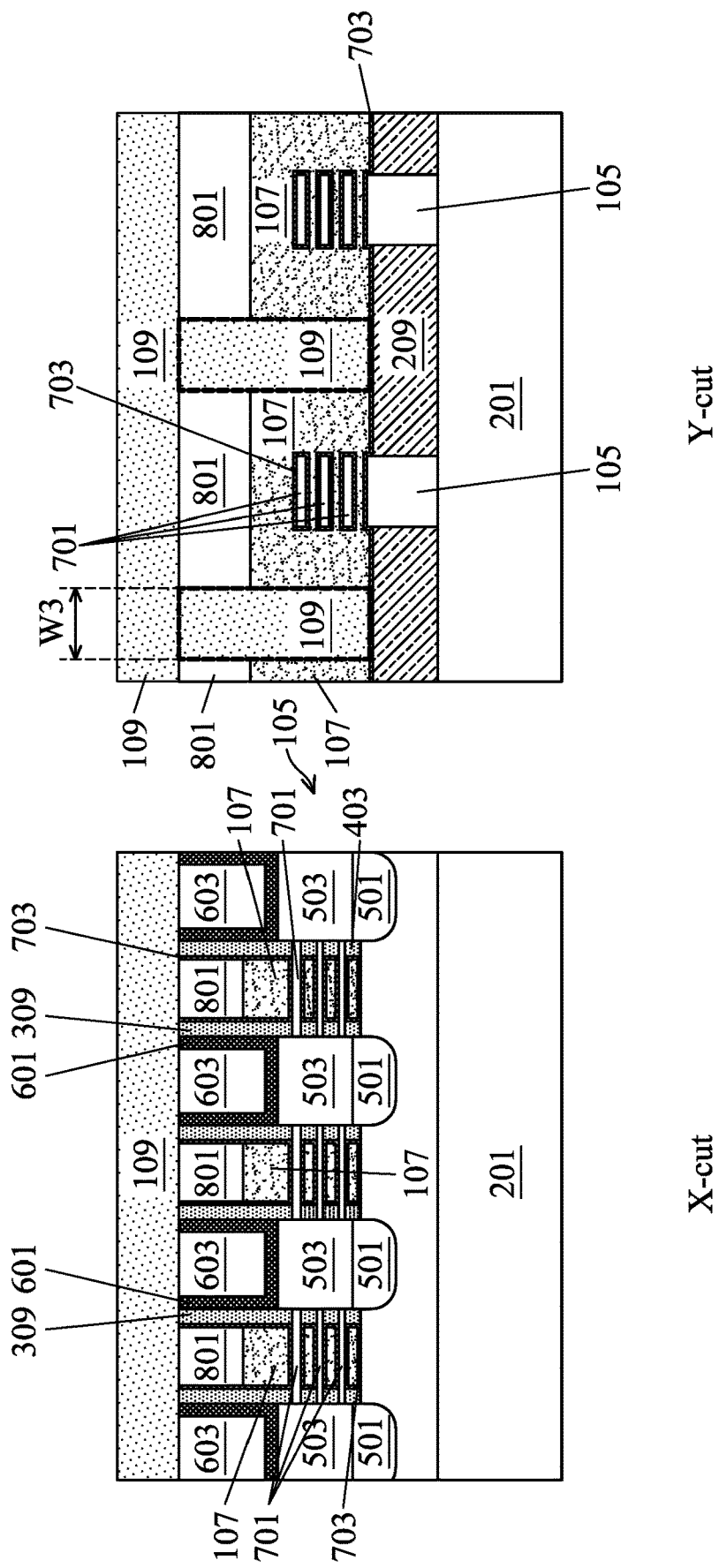
Figure 10B Y-cut
Figure 10A X-cut

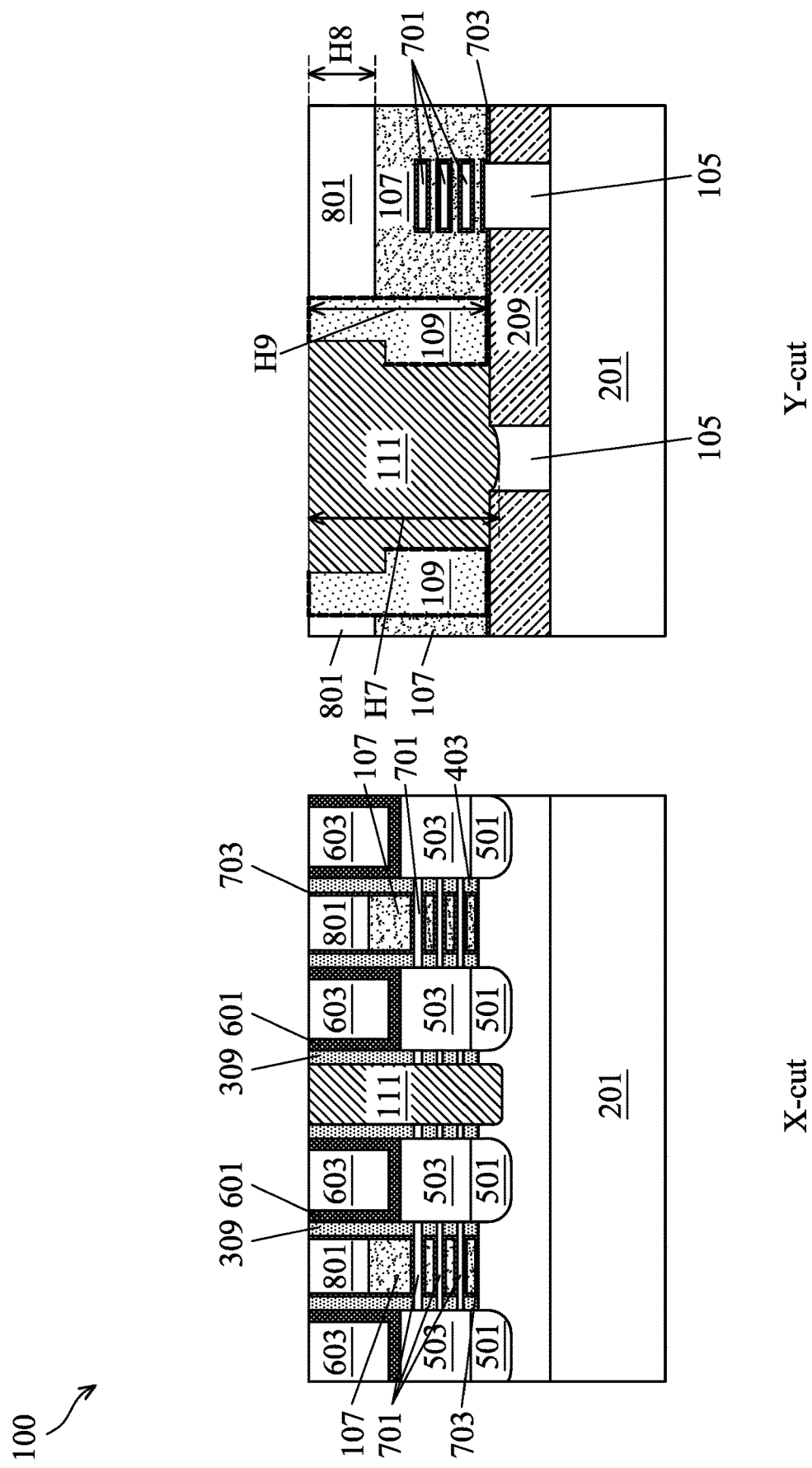
Figure 13B Y-cut
Figure 13A X-cut

SEMICONDUCTOR DEVICES AND METHODS OF MANUFACTURE

PRIORITY CLAIM AND CROSS-REFERENCE

This application is a divisional of U.S. patent application Ser. No. 16/872,058, entitled: "Semiconductor Devices and Methods of Manufacture," filed on May 11, 2020, which claims the benefit of U.S. Provisional Application No. 62/927,582, entitled: "Shallow CPODE Etching for GAA with SSD BT Spa," filed on Oct. 29, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B illustrates cross-sectional views of forming dummy gate stacks over the fins, in accordance with some embodiments.

FIGS. 4A-4C illustrates cross-sectional views of forming openings and inner spacers in the multi-layer structure, in accordance with some embodiments.

FIGS. 5A-5C illustrates cross-sectional views of forming bottom spacers and source/drain regions, in accordance with some embodiments.

FIGS. 6A-6B illustrates cross-sectional views of forming an inter-layer dielectric (ILD) layer and planarization process, in accordance with some embodiments.

FIGS. 10A-10B illustrates cross-sectional views of forming cut-metal gate dielectric plugs, in accordance with some embodiments.

FIGS. 13A-13B illustrates cross-sectional views of forming the CPODE structure in the GAA semiconductor device, in accordance with some embodiments.

DETAILED DESCRIPTION

Figure 1:
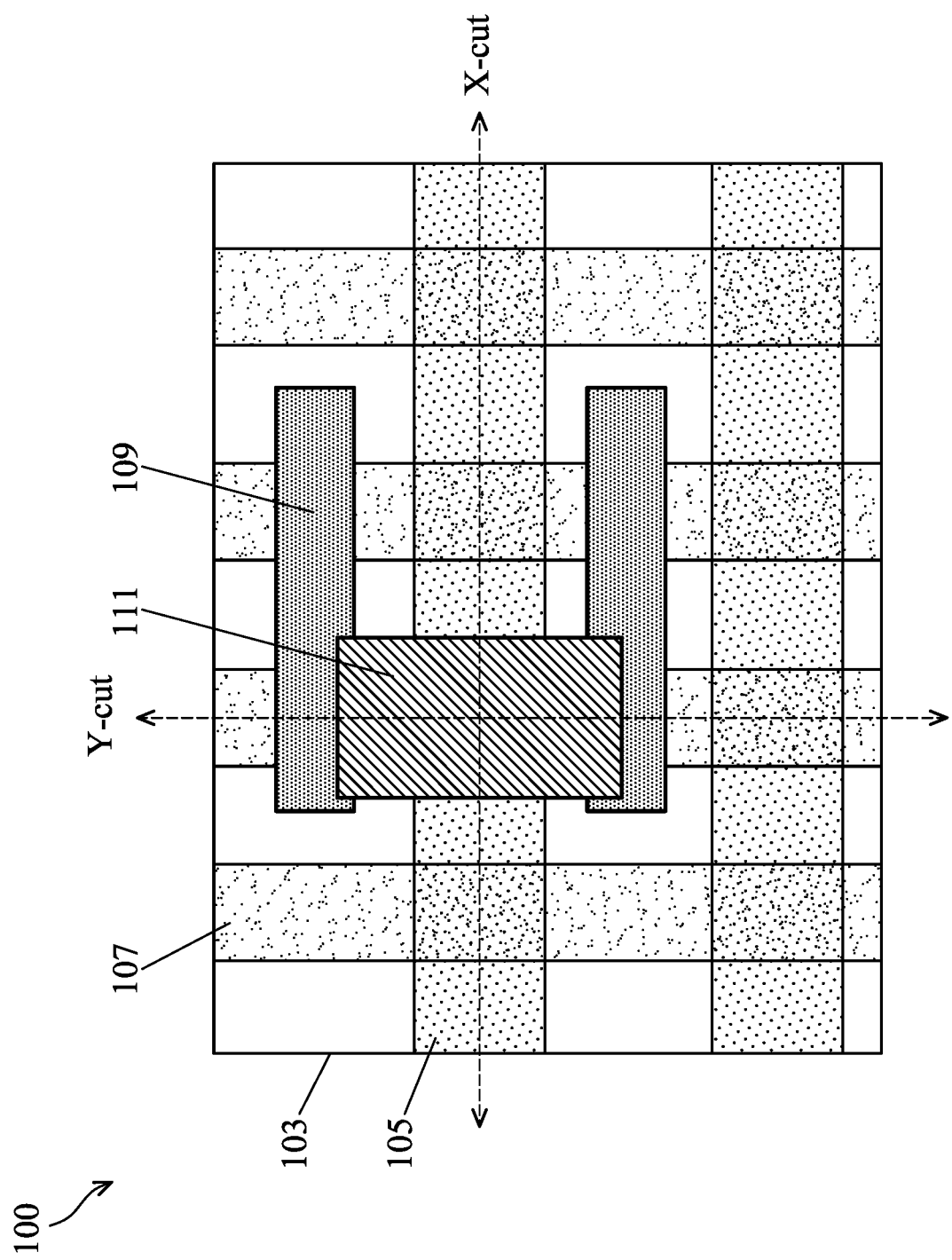
FIG. 1 illustrates a top-down view of a gate-all-around (GAA) semiconductor device, according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a top-down view of an intermediate structure in forming a gate-all-around (GAA) semiconductor device 100, according to some embodiments. In particular, FIG. 1 illustrates a multi-layer structure 103 comprising a plurality of nanosheets formed over a semiconductor substrate 101 (illustrated in the following figures), fins 105 formed in the multi-layer structure 103, and a plurality of gate electrodes 107 over the fins 105. FIG. 1 further illustrates a plurality of cut-metal gate structures 109 separating two of the gate electrodes 107 and a Continuous Poly On Diffusion Edge (CPODE) structure 111 dividing one of the fins 105 in two and intersecting the cut-metal gate structures 109.

Although two fins 105 are illustrated in FIG. 1 and in the following figures, it is understood that depending on the desired design and number of the GAA semiconductor devices 100, any suitable number of fins 105 may be formed in the multi-layer structure 103 to form the desired GAA semiconductor devices 100. Furthermore, any suitable number of gate electrodes 107, CPODE structures 111, and cut-metal gate structures 109 may be formed to form the desired GAA semiconductor devices 100.

FIG. 1 further illustrates a first cutline (X-cut) and a second cutline (Y-cut) taken through the intermediate structure. The first cutline (X-cut) is taken through the length of the fin 105 divided in two and through the CPODE structure 111. The second cutline (Y-cut) is taken through the length of one of the gate electrodes 107 separated by the two cut-metal gate structures 109, through the two cut-metal gate structures 109, and through the CPODE structure 111 intersecting the two cut-metal gate structures 109.

Figure 2B:
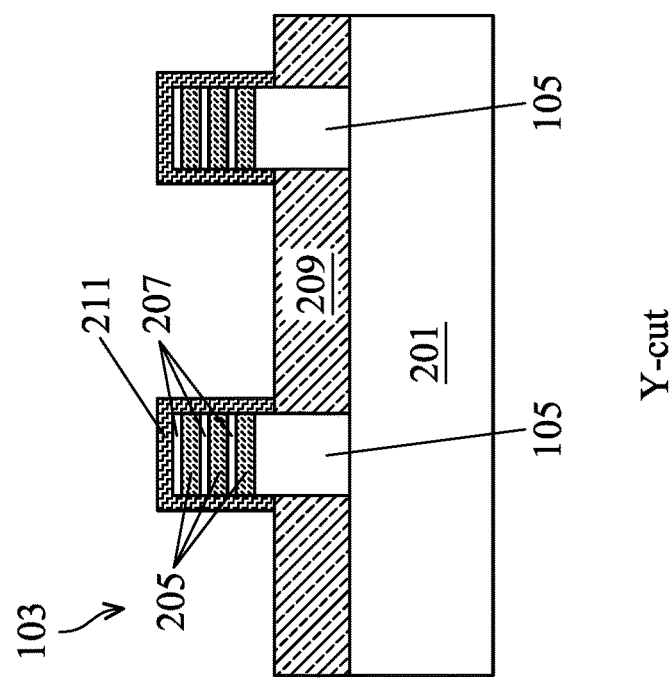
FIGS. 2A-2B illustrates cross-sectional views of forming a multi-layer structure and forming fins in the multi-layer structure, in accordance with some embodiments.
Figure 2A:
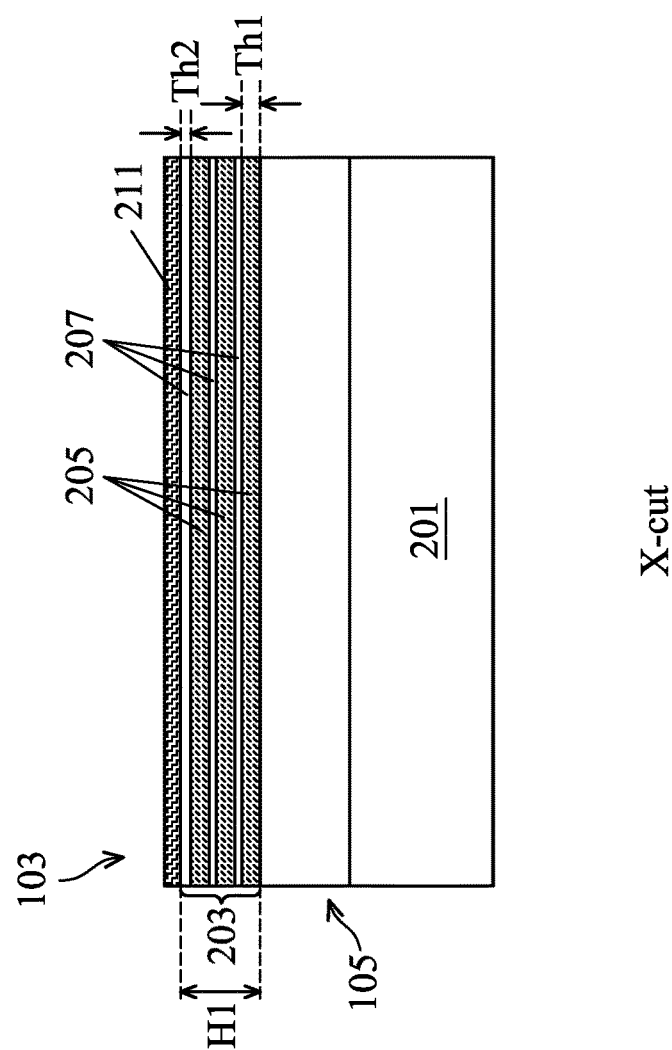

FIGS. 2A-2B illustrates cross-sectional views of forming the multi-layer structure 103 and forming the fins 105 in the multi-layer structure 103, in an intermediate step of forming the GAA semiconductor device 100, in accordance with some embodiments. In particular, FIG. 1 illustrates a substrate 201 into which dopants may be implanted in order to form wells. In an embodiment the substrate 201 is a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). The substrate 201 may be doped or un-doped. In some embodiments, the substrate 201 may be a bulk semiconductor substrate, such as a bulk silicon substrate that is a wafer, a semiconductor-on-insulator (SOI) substrate, a multi-layered or gradient substrate, or the like.

FIGS. 2A-2B further illustrate a deposition process to form the multi-layer structure 103 in an intermediate stage of manufacturing the GAA semiconductor device 100, according to some embodiments. In particular, FIG. 2A further illustrates a series of depositions that are performed to form a multi-layer stack 203 of alternating materials of first layers 205 and second layers 207 over the substrate 201.

According to some embodiments, the first layers 205 may be formed using a first semiconductor material with a first lattice constant, such as SiGe, Ge, Si, GaAs, InSb, GaSb, InAlAs, InGaAs, GaSbP, GaAsSb, combinations of these, or the like. In some embodiments, a first layer 205 of the first semiconductor material (e.g., SiGe) is epitaxially grown on the substrate 201 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer CVD (ALCVD), ultrahigh vacuum CVD (UHVCVD), reduced pressure CVD (RPCVD), a combination thereof, or the like, may also be utilized. In some embodiments, the first layer 205 is formed to first thicknesses Th1 of between about 3 nm and about 10 nm. However, any suitable thickness may be utilized while remaining within the scope of the embodiments.

Once the first layer 205 has been formed over the substrate 201, a second layer 207 may be formed over the first layer 205. According to some embodiments, the second layers 207 may be formed using a second semiconductor material such as Si, SiGe, Ge, GaAs, InSb, GaSb, InAlAs, InGaAs, GaSbP, GaAsSb, combinations of these, or the like with a second lattice constant that is different from the first lattice constant of the first layer 205. In a particular embodiment in which the first layer 205 is silicon germanium, the second layer 207 is a material such as silicon. However, any suitable combination of materials may be utilized for the first layers 205 and the second layers 207.

In some embodiments, the second layer 207 is epitaxially grown on the first layer 205 using a deposition technique similar to that used to form the first layer 205. However, the second layer 207 may use any of the deposition techniques suitable for forming the first layer 205, as set forth above or any other suitable technique. According to some embodiments, the second layer 207 is formed to a similar thickness to that of the first layer 205. However, the second layer 207 may also be formed to a thickness that is different from the first layer 205. According to some embodiments, the second layer 207 may be formed to a second thickness Th2 of between about 5 nm and about 15 nm. However, any suitable thickness may be used.

Once the second layer 207 has been formed over the first layer 205, the deposition process is repeated to form the remaining material layers in the series of alternating materials of the first layers 205 and the second layers 207 until a desired topmost layer of the multi-layer stack 203 has been formed. According to the present embodiment, the first layers 205 may be formed to a same or similar first thickness and the second layers 207 may be formed to the same or similar second thickness. However, the first layers 205 may have different thicknesses from one another and/or the second layers 207 may have different thicknesses from one another and any combination of thicknesses may be used for the first layers 205 and the second layers 207. According to the present embodiment, the topmost layer of the multi-layer stack 203 is formed as a second layer 207; however, in other embodiments, the topmost layer of the multi-layer stack 203 may be formed as a first layer 205. Additionally, although embodiments are disclosed herein comprising three of the first layers 205 and three of the second layers 207, the multi-layer stack 203 may have any suitable number of layers (e.g., nanosheets). For example, the multi-layer stack 203 may comprise multiple nanosheets in a range between 2 to 10 nanosheets. In some embodiments, the multi-layer stack 203 may comprise equal numbers of the first layers 205 to the second layers 207; however, in other embodiments, the number of the first layers 205 may be different from the number of the second layers 207. According to some embodiments, the multi-layer stack 203 may be formed to a first height H1 of between about 12 nm and about 100 nm. However, any suitable height may be used.

FIGS. 2A-2B further illustrate, a patterning process of the multi-layer structure 103 and a formation of isolation regions 209 in an intermediate stage of manufacturing the GAA semiconductor device 100, in accordance with some embodiments. The patterning process is used to form fins 105 in the multi-layer structure 103 and to form trenches between the fins 105 in preparation for forming the isolation regions 209. The patterning process for forming the fins 105, according to some embodiments, comprises applying a photoresist over the multi-layer stack 203 and then patterning and developing the photoresist to form a mask over the multi-layer stack 203. Once formed, the mask is then used during an etching process, such as an anisotropic etching process to transfer the pattern of the mask into the underlying layers to form the trenches through the multi-layer stack 203 and into the substrate 201 to define the fins 105, wherein the fins 105 are separated by the trenches.

Additionally, while a single mask process has been described, this is intended to be illustrative and is not intended to be limiting, as the gate all around (GAA) device structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

In an embodiment the isolation regions 209 are formed as shallow trench isolation regions by depositing a dielectric material in the trenches. According to some embodiments, the dielectric material used to form the isolation regions 209 may be a material such as an oxide material (e.g., a flowable oxide), high-density plasma (HDP) oxide, or the like. The dielectric material may be formed, after an optional cleaning and lining of the trenches, using either a chemical vapor deposition (CVD) method (e.g., the HARP process), a high density plasma CVD method, or other suitable method of formation to fill or overfill the regions around the fins 105. In some embodiments, a post placement anneal process (e.g., oxide densification) is performed to densify the material of the isolation regions 209 and to reduce its wet etch rate. A chemical mechanical polishing (CMP), an etch, a combination of these, or the like may be performed to remove any excess material of the isolation regions 209.

Once the dielectric material has been deposited to fill or overfill the regions around the fins 105, the dielectric material may then be recessed away from the surface of the fins 105 to form the isolation regions 209. The recessing may be performed to expose at least a portion of the sidewalls of the fins 105 adjacent to the top surface of the fins 105. The dielectric material may be recessed using a wet etch by dipping the top surface of the fins 105 into an etchant selective to the material of the dielectric material, although other methods, such as a reactive ion etch, a dry etch, chemical oxide removal, or dry chemical clean may be used.

FIGS. 2A-2B further illustrate the formation of a dummy gate dielectric 211 over the exposed portions of the fins 105. Once the isolation regions 209 have been formed, the dummy gate dielectric 211 may be formed by thermal oxidation, chemical vapor deposition, sputtering, or any other methods known and used in the art for forming a gate dielectric. Depending on the technique of gate dielectric formation, the dummy gate dielectric 211 thickness on the top may be different from the dummy dielectric thickness on the sidewall. In some embodiments, the dummy gate dielectric 211 may be formed by depositing a material such as silicon and then oxidizing or nitridizing the silicon layer in order to form a dielectric such as the silicon dioxide or silicon oxynitride. In such embodiments, the dummy gate dielectric 211 may be formed to a thickness ranging from between about 3 Å and about 100 Å, such as about 10 Å. In other embodiments, the dummy gate dielectric 211 may also be formed from a high permittivity (high-k) material such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used for the dummy gate dielectric 211.

Turning to FIGS. 3A-3B, these figures illustrate the formation of dummy gate stacks 301 over the fins 105, in accordance with some embodiments. According to some embodiments, the dummy gate stacks 301 comprise the dummy gate dielectric 211, a dummy gate electrode 303 over the dummy gate dielectric 211, a first hard mask 305 over the dummy gate electrode 303, and a second hard mask 307 over the first hard mask 305.

In some embodiments, the dummy gate electrode 303 comprises a conductive material and may be selected from a group comprising of polysilicon, W, Al, Cu, AlCu, W, Ti, TiAlN, TaC, TaCN, TaSiN, Mn, Zr, TiN, Ta, TaN, Co, Ni, combinations of these, or the like. The dummy gate electrode 303 may be deposited by chemical vapor deposition (CVD), sputter deposition, or other techniques known and used in the art for depositing conductive materials. The thickness of the dummy gate electrode 303 may be in the range of about 5 Å to about 500 Å. The top surface of the dummy gate electrode 303 may have a non-planar top surface, and may be planarized prior to patterning of the dummy gate electrode 303 or gate etch. Ions may or may not be introduced into the dummy gate electrode 303 at this point. Ions may be introduced, for example, by ion implantation techniques.

Once the dummy gate electrode 303 has been formed, the dummy gate dielectric 211 and the dummy gate electrode 303 may be patterned. In an embodiment the patterning may be performed by initially forming a first hard mask 305 over the dummy gate electrode 303 and forming the second hard mask 307 over the first hard mask 305.

According to some embodiments, the first hard mask 305 comprises a dielectric material such as silicon nitride (SiN), oxide (OX), silicon oxide (SiO), titanium nitride (TiN), silicon oxynitride (SiON), combinations of these, or the like. The first hard mask 305 may be formed using a process such as chemical vapor deposition, plasma enhanced chemical vapor deposition, atomic layer deposition, or the like. However, any other suitable material and method of formation may be utilized. The first hard mask 305 may be formed to a thickness of between about 20 Å and about 3000 Å, such as about 20 Å.

The second hard mask 307 comprises a separate dielectric material from the material of the first hard mask 305. The second hard mask 307 may comprise any of the materials and use any of the processes suitable for forming the first hard mask 305 and may be formed to a same or similar thickness as the first hard mask 305. In embodiments where the first hard mask 305 comprises silicon nitride (SiN), the second hard mask 307 may be e.g., an oxide (OX). However, any suitable dielectric materials, processes and thicknesses may be used to form the second hard mask.

Once the first hard mask 305 and the second hard mask 307 have been formed, the first hard mask 305 and the second hard mask 307 may be patterned. In an embodiment the first hard mask 305 and the second hard mask 307 may be patterned by initially placing a photoresist (not individually illustrated) over the first hard mask 305 and the second hard mask 307 and exposing the photoresist to a patterned energy source (e.g., light) in order to initiate a chemical reaction that modifies the physical properties of the exposed portions of the first photoresist. The first photoresist may then be developed by applying a first developer (also not individually illustrated) in order to utilize the modified physical properties between the exposed region and the unexposed region to selectively remove either the exposed region or the unexposed region.

Once the photoresist has been patterned, the photoresist may be used as a mask in order to pattern the underlying first hard mask 305 and the second hard mask 307. In an embodiment the first hard mask 305 and the second hard mask 307 may be patterned using, e.g., one or more reactive ion etching (RIE) processes with the photoresist as a mask. The patterning process may be continued until the dummy gate electrode 303 is exposed beneath the first hard mask 305.

Once the first hard mask 305 and the second hard mask 307 have been patterned, the photoresist may be removed utilizing, e.g., an ashing process, whereby a temperature of the photoresist is raised until the photoresist experiences a thermal decomposition and may be easily removed using one or more cleaning process. However, any other suitable removal process may be utilized.

Once the first hard mask 305 and the second hard mask 307 have been patterned, the dummy gate electrode 303 and the dummy gate dielectric 211 may be patterned in order to form a series of dummy gate stacks 301. In an embodiment the dummy gate electrode 303 and the dummy gate dielectric 211 are patterned using an anisotropic etching process, such as a reactive ion etch, although any suitable process may be utilized.

FIGS. 3A-3B further illustrate a formation of top spacers 309. According to an embodiment, a spacer material is formed by blanket deposition on the dummy gate stacks 301 and the multi-layer structure 103. As such, the spacer material is deposited over the top surfaces and sidewalls of the dummy gate stacks 301, the top surfaces and sidewalls of the fins 105 and top surfaces of the isolation regions 209. According to some embodiments, the spacer material comprises a dielectric material and is formed may be formed using methods such as chemical vapor deposition (CVD), plasma enhanced CVD, sputter, thermal oxidation, and any other suitable methods. According to some embodiments, the spacer material comprises materials such as silicon oxide ($SiO_2$), silicon oxynitride (SiON), silicon nitride (Si3N4), silicon oxycarbide (SiOC), silicon oxycarbonitride (SiOCN), although any suitable material, such as low-k materials with a k-value less than about 4.0, combination thereof, or the like may be utilized.

Once formed, the spacer material may be etched in order to shape the top spacers 309 on the dummy gate stacks 301 and the fins 105 to expose the tops of the dummy gate stacks 301 and fins 105. According to some embodiments, the spacer material may be etched using an anisotropic etching process (e.g., a dry etching process) such as a reactive ion etching (RIE) process, an isotropic etching process (e.g., a wet etching process), combination thereof, or the like. In some embodiments, the spacer material formed over the fins 105 in source/drain regions may be recessed during the etching process and/or during a subsequent etching process such that portions along the sidewalls of the fins 105 in those source/drain regions are exposed.

However, while embodiments are described using a single spacer material, this is intended to be illustrative and is not intended to be limiting. Rather, any number of spacer materials and any combinations of deposition and removal processes may be used, and all such processes are fully intended to be included within the scope of the embodiments.

Figure 4C:
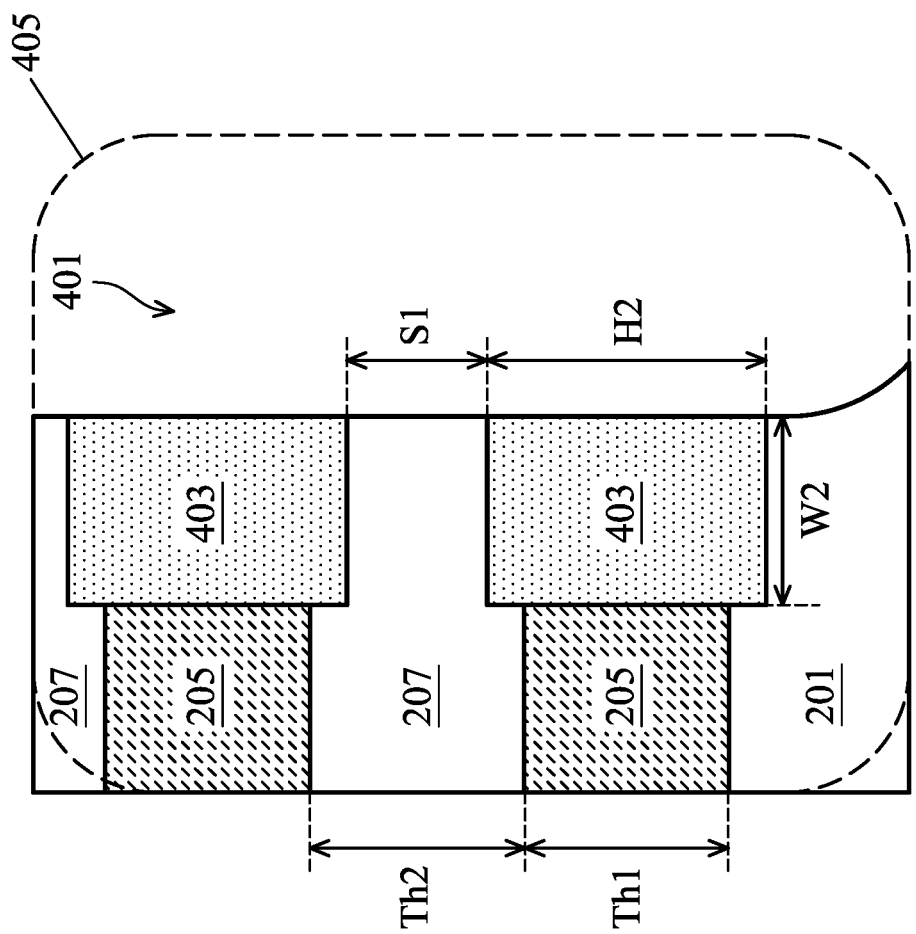

FIGS. 4A to 4C illustrate cross-sectional views of forming first openings 401 and inner spacers 403 in the fins 105, in accordance with some embodiments. During the formation of the top spacers 309, the multi-layer stack 203 will be re-exposed by the removal of the spacer material used for the top spacers 309. Once exposed, an etching process to remove material from the multi-layer stack 203 and the substrate may be performed to form the first openings 401 (e.g., trenches, recesses, channels or the like) which extend through the multi-layer stack 203 and into the semiconductor substrate 101 in preparation for forming source/drain regions therein. In an embodiment, the etching may be performed using one or more anisotropic etches, such as reactive ion etches, although any suitable processes may be utilized.

In an embodiment, the first openings 401 may be formed to have a first width W1 of between about 10 nm and about 40 nm, such as about 20 nm. Additionally, the first openings 401 may be formed to extend into the substrate 101 a first depth D1 of between about 3 nm and about 40 nm, such as about 10 nm. However, any suitable dimensions may be utilized.

FIGS. 4A-4C further illustrate the formation of inner spacers 403 in the first layers 205. In particular, FIG. 4C illustrates a magnified view a section 405 that is highlighted in FIG. 4A by a dashed line and may be referenced with the following discussion with regard to the formation of the inner spacers 403. In some embodiments, the inner spacers 403 are formed by patterning recesses using a wet etch with an etchant that is more selective to the material of the first layers 205 (e.g., silicon germanium (SiGe)) than the material of the second layers 207 (e.g., silicon (Si)) or the substrate 201 (e.g., silicon (Si)). For example, in an embodiment in which the first layers 205 are silicon germanium and the second layers 207 are silicon, the wet etch may use an etchant such as hydrochloric acid (HCl).

In an embodiment the wet etching process may be a dip process, a spray process, a spin-on process, or the like and may be performed using any suitable process temperatures (e.g., between about 400° C. and about 600° C.) and any suitable process times (e.g., between about 100 seconds and about 1000 seconds, such as about 300 seconds). However, any suitable process conditions and parameters may be utilized. The etching process may be continued such that recesses with facet limited surfaces are formed in each of the first layers 205 to any desired distance from the sidewall of the first openings 401.

Additionally, the selectivity of the etchant may be chosen. According to some embodiments, the etching process may also be performed to remove portions of the second layers 207 and the substrate 201 such that a size of the recesses extends vertically in the direction of the sidewall of the first openings 401 to any suitable height (described further below).

However, a wet etching process is not the only process that may be utilized to recess the first layers 205. For example, in another embodiment the recessing of the first layers 205 may be performed with an isotropic dry etching process or a combination of a dry etching process and a wet etching process. Any suitable process of recessing the first layers 205 may be utilized, and all such processes are fully intended to be included within the scope of the embodiments.

Once the recesses are formed in each of the first layers 205, a spacer material is formed over the multi-layer structure 103. In some embodiments, the spacer material can be different from the material of the top spacers 309 and can be a dielectric material comprising silicon such as silicon nitride (SiN), silicon oxide ($SiO_2$), silicon oxynitride (SiON), silicon oxycarbonitride (SiOCN), silicon carbonitride (SiCN), silicon oxycarbide (SiOC), although any suitable material such as low-k materials with a k-value less than about 4.0, or even an air gap, or combination thereof may also be utilized. The spacer material may be deposited using a deposition process such as chemical vapor deposition, physical vapor deposition, or atomic layer deposition to a thickness of between about 2 nm and about 10 nm, such as about 5 nm. However, any suitable thickness or deposition process may be utilized.

By depositing the spacer material over the 103, the spacer material will line the sidewalls of the first openings 401 and will also fill in the recesses in the first layers 205. Once the recesses have been filled with the spacer material, a removal process is then performed to remove any excess spacer material from the first openings 401, while leaving behind the inner spacers 403. In an embodiment, the removal of the excess spacer material may be performed using an etching process such as, e.g., an anisotropic, dry etching process such as a reactive ion etching process. However, any suitable etching process, which removes the excess spacer material from the first openings 401 while leaving behind the inner spacers 403, may be utilized.

By filling the recesses with the spacer material and removing the excess spacer material from the first openings 401, the inner spacers 403 will take on the shape of the recesses. Additionally, while an embodiment forming the inner spacers 403 to faceted shapes is described, this is intended to be illustrative and is not intended to be limited. Rather, any suitable shape, such as a concave shape or a convex shape, or even the inner spacers 403 being recessed may be utilized. All such shapes are fully intended to be included within the scope of the embodiments. According to some embodiments, the inner spacers 403 may be formed to a second width W2 of between about 2 nm and about 10 nm, such as about 5 nm and a second height H2 of between about 5 nm and about 20 nm, such as about 10 nm. Furthermore, the inner spacers 403 may be spaced apart by a first spacing $S_1$ of between about 3 nm and about 10 nm, such as about 5 nm. However, any suitable widths, heights, and distances may be utilized.

FIG. 4C further illustrates relative dimensions between the first layers 205, the second layers 207, and the inner spacers 403. According to some embodiments, the second height H2 of the inner spacers 403 is greater than the height of the first layers 205 (e.g., first thickness Th1). In some embodiments, the first spacing S1 between the inner spacers 403 is less than the second thickness Th2 of the second layers 207. However, any suitable dimensions may be utilized.

Figure 5C:
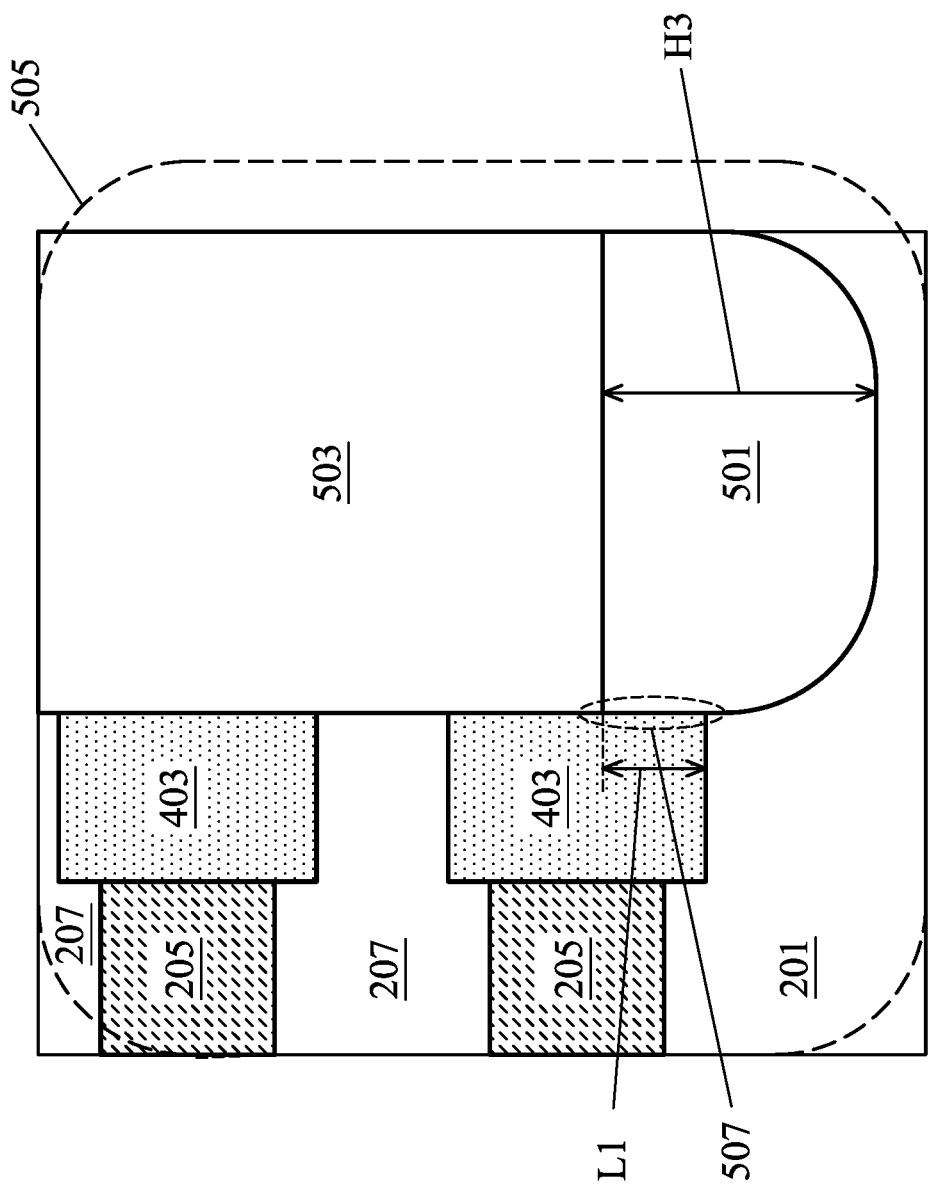

FIGS. 5A-5C illustrates cross-sectional views of forming bottom spacers 501 and source/drain regions 503, in accordance with some embodiments. In particular, FIG. 5C illustrates a magnified view of a section 505 highlighted in FIG. 5A with a dashed line.

Once the inner spacers 403 have been formed, the bottom spacers 501 are formed at the bottom of the first openings 401 using a semiconductor material, such as silicon germanium (SiGe), although other suitable materials such as those suitable for forming the first layers 205 may also be utilized. According to some embodiments, the bottom spacers 501 are formed using SiGe and are epitaxially grown at the bottom of the first openings 401 using a deposition technique such as epitaxial growth, vapor-phase epitaxy (VPE), molecular beam epitaxy (MBE). However, any other deposition process suitable for forming the first layers 205 may also be used.

Once deposited, an oxidation process may be performed to increase a density, and/or a dielectric constant of the bottom spacers 501. As such, the bottom spacers 501 may be formed as silicon germanium oxide (e.g., SiGeOx, SiGeON, SiGeOCN, or the like). After the oxidation process, an etching process (e.g., wet etch) may be performed to remove any oxide formed along sidewalls of the first openings 401 and/or to recess the bottom spacers 501 to a desired height. According to some embodiments, the bottom spacers 501 are formed to a third height H3 of between about 3 nm and about 30 nm, such as about 20 nm. However, any suitable height may be used.

Once the bottom spacers 501 have been formed to the desired height, a post placement anneal process may be performed to remove the germanium (Ge) from the material of the bottom spacers 501. According to some embodiments, the anneal process may comprise one or more anneal processes (e.g., a steam anneal, a high temperature anneal, combinations, or the like) can be performed in a furnace or in a rapid thermal processing (RTP) chamber. According to some embodiments, the post placement anneal process comprises a dry anneal using, for example, nitrogen (N2) at a process temperature in a range from between about 500° C. and about 700° C., such as about 600° C. for a duration of between about 30 minutes and about 180 minutes, such as about 60 min. However, any suitable oxygen sources, process temperatures, and process times may be utilized. Once the post placement anneal process has completed, the germanium has been removed and the bottom spacers 501 are transformed into a dielectric material such as, silicon nitride (SiN), oxide (OX), silicon oxynitride (SiON), silicon oxycarbonitride (SiOCN), silicon carbonitride (SiCN), or the like).

FIG. 5C further illustrates a spacer interface 507 between the bottommost spacer of the inner spacers 403 and the bottom spacer 501. According to some embodiments, the spacer interface 507 has a first length L1 that is between about 3 nm and about 15 nm, such as about 5 nm. However, any suitable length may be used for the spacer interface 507.

In some other embodiments, the bottom spacers 501 may be formed by depositing a second spacer material such as SiON using a process such as chemical vapor deposition (CVD), atomic layer deposition (ALD), plasma enhanced chemical vapor deposition (PECVD), or the like. However, any suitable spacer material and deposition process may be used such as those materials and processes suitable for forming the top spacers 309. According to some embodiments, the second spacer material is different from the material of the top spacers 309 and the inner spacers 403 and is deposited to fill and/or overfill the first openings 401.

Once deposited, the second spacer material may be etched in order to recess the bottom spacers 501 to the desired third height H3 and to expose the sidewalls in the first openings 401 above the bottom spacers 501. According to some embodiments, the second spacer material may be etched using an anisotropic etching process (e.g., a dry etching process) such as a reactive ion etching (RIE) process, an isotropic etching process (e.g., a wet etching process), combination thereof, or the like. The etchants used to recess the bottom spacers 501 are selective to the second spacer material without significantly removing the materials of the top spacers 309, the second layers 207, and the inner spacers 403.

Once the bottom spacers 501 have been formed, the source/drain regions 503 may be formed over the bottom spacers 501. The source/drain regions 503 may be formed using a growth process such as a selective epitaxial process with a semiconductor material suitable for the device desired to be formed. For example, in an embodiment in which the source/drain regions 503 are utilized to form an NMOS device, the source/drain regions 503 may be a semiconductor material such as silicon, silicon phosphorous, silicon carbon phosphorous, combinations, of these, or the like.

The epitaxial growth process may use precursors such as silane, dichlorosilane, germane, and the like, and may continue for between about 5 minutes and about 120 minutes, such as about 30 minutes. According to some embodiments, the source/drain regions 503 are formed to a fourth height H4 of between about 30 nm and about 90 nm, such as about 50 nm. However, any suitable heights and/or suitable depths may be used.

Once the source/drain regions 503 are formed, dopants may be implanted into the source/drain regions 503 by implanting appropriate dopants to complement the dopants within the remainder of the first device region. For example, n-type dopants such as phosphorous (P), carbon (C), arsenic (As), silicon (Si), antimony (Sb), or the like, and combinations thereof (e.g., SiP, SiC, SiPC, SiAs, Si, Sb, etc.) may be implanted to form NMOSFET devices. These dopants may be implanted using the dummy gate stacks 301 and the top spacers 309 as masks.

In another embodiment, the dopants of the source/drain regions 503 may be placed during the growth of the source/drain regions 503. For example, phosphorous may be placed in situ as the source/drain regions 503 are being formed. Any suitable process for placing the dopants within the source/drain regions 503 may be utilized, and all such processes are fully intended to be included within the scope of the embodiments. Furthermore, an anneal process may be performed to activate the dopants within the source/drain regions 503. During the anneal process, dopants of the source/drain regions 503 may laterally diffuse into the second layers 207 at the interfaces between the second layers 207 and the source/drain regions 503. As such, lightly doped drain (LDD) regions may be formed within the second layers 207.

FIGS. 6A-6B illustrates cross-sectional views of forming of a contact etch stop layer 601 and an interlayer dielectric layer 603, in accordance with some embodiments. FIGS. 6A-6B further illustrate the removal of the first hard mask 305 and the second hard mask 307 and planarization of the contact etch stop layer 601 and the interlayer dielectric layer 603 with the dummy gate electrode 303 and top spacers 309.

The contact etch stop layer 601 is formed over the structure illustrated in FIGS. 5A-5C, and an interlayer dielectric layer 603 is formed over the contact etch stop layer 601. The contact etch stop layer 601 functions as an etch stop layer in a subsequent etching process, and may comprise a suitable material such as silicon nitride (SiN), silicon oxynitride (SiON), silicon carbon nitride (SiCN), combinations thereof, or the like, and may be formed by a suitable formation method such as chemical vapor deposition (CVD), physical vapor deposition (PVD), combinations thereof, or the like.

The interlayer dielectric layer 603 may comprise a material such as silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass, Spin-On-Polymers, silicon carbon material, a compound thereof, a composite thereof, the like, or a combination thereof, although any suitable dielectrics may be used. The interlayer dielectric layer 603 may be formed using a process such as plasma enhanced chemical vapor deposition (PECVD), although other processes, such as low pressure chemical vapor deposition (LPCVD), may also be used.

Once formed, the interlayer dielectric layer 603 and the contact etch stop layer 601 may be planarized with the dummy gate electrode 303 and top spacers 309 using a planarization process such as chemical mechanical planarization (CMP). However, any suitable planarization process may be utilized. Furthermore, the first hard mask 305 and the second hard mask 307 may be removed during the planarization process. According to some embodiments, one or more etching processes and/or the chemical mechanical planarization (CMP) may be utilized to remove the first hard mask 305 and the second hard mask 307. As such, the dummy gate electrode 303 is exposed after the removal of the first hard mask 305.

Figures 7A, 7B:
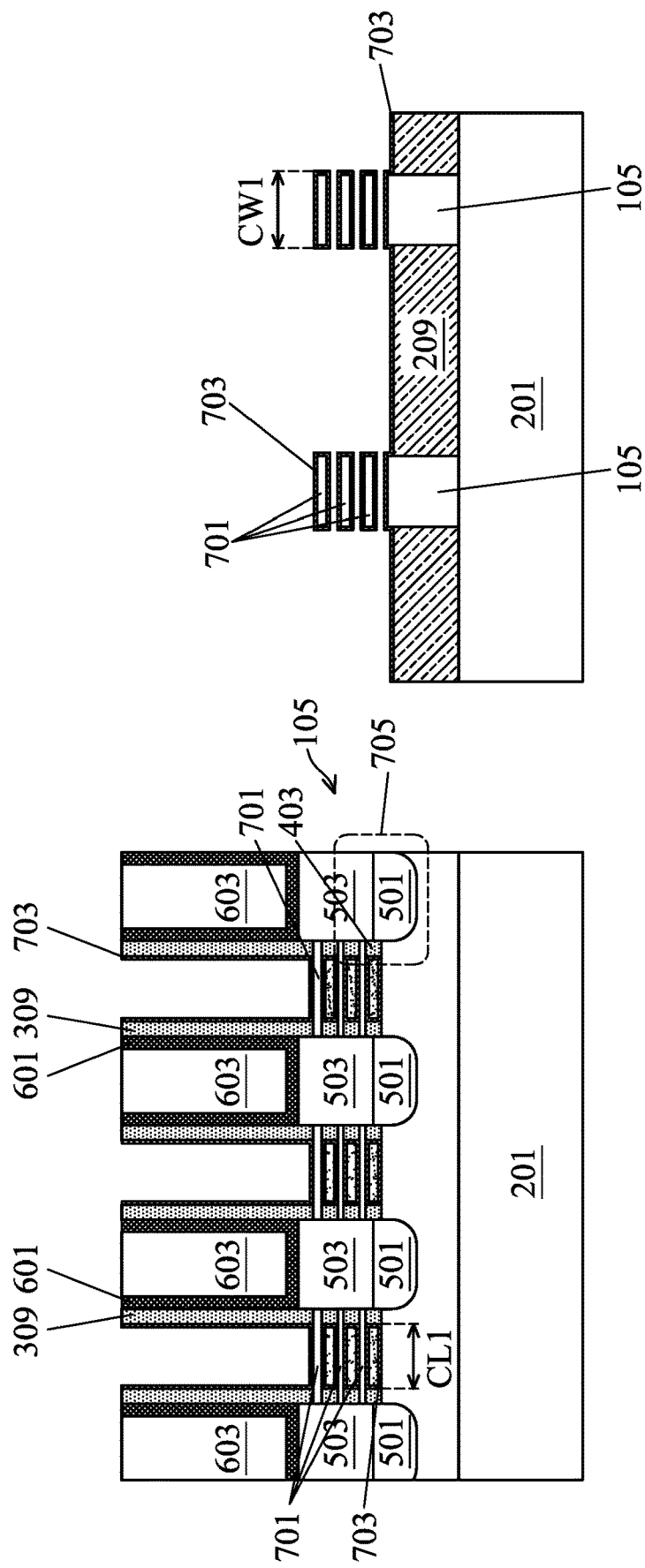
FIGS. 7A-7C illustrates cross-sectional views of removing the dummy gate stacks, performing a wire-release process, and forming a gate dielectric in accordance with some embodiments.

FIGS. 7A-7B illustrates cross-sectional views of removing the dummy gate electrode 303 and the dummy gate dielectric 211. FIGS. 7A-7B further illustrate a wire-release process to form nanostructures 701 from the second layers 207, in accordance with some embodiments. FIGS. 7A-7B further illustrate the formation of a gate dielectric 703 over the nanostructures 701, according to some embodiments.

Once exposed, the dummy gate electrode 303 may be removed in order to expose the underlying dummy gate dielectric 211. In an embodiment the dummy gate electrode 303 is removed using, e.g., one or more wet or dry etching process that utilizes etchants that are selective to the material of the dummy gate electrode 303. However, any suitable removal process may be utilized.

Once the dummy gate dielectric 211 has been exposed, the dummy gate dielectric 211 may be removed. In an embodiment the dummy gate dielectric 211 may be removed using, e.g., a wet etching process, although any suitable etching process may be utilized.

FIGS. 7A-7B further show that, once the dummy gate dielectric 211 has been removed (which also exposes the sides of the first layers 205), the first layers 205 may be removed from between the substrate 201 and from between the second layers 207 in a wire release process step. The wire release process step may also be referred to as a sheet release process step, a sheet formation process step, a nanosheet formation process step or a wire formation process step. In an embodiment the first layers 205 may be removed using a wet etching process that selectively removes the material of the first layers 205 (e.g., silicon germanium (SiGe)) without significantly removing the material of the substrate 201 and the material of the second layers 207 (e.g., silicon (Si)). However, any suitable removal process may be utilized.

For example, in an embodiment, an etchant such as a high temperature HCl may be used to selectively remove the material of the first layers 205 (e.g., SiGe) without substantively removing the material of the substrate 201 and/or the material of the second layers 207 (e.g., Si). Additionally, the wet etching process may be performed at a temperature of between about 400° C. and about 600° C., such as about 560° C., and for a time of between about 100 seconds and about 600 seconds, such as about 300 seconds. However, any suitable etchant, process parameters, and time can be utilized.

By removing the material of the first layers 205, the sides of the second layers 207 (relabeled nanostructures 701 in FIGS. 7A-7B) are exposed. The nanostructures 701 are separated from each other by the inner spacers 403. According to some embodiments, the nanostructures 701 are separated by a spacing of between about 5 nm and about 15 nm, such as about 10 nm. The nanostructures 701 comprise the channel regions between opposite ones of the source/drain regions 503 and have a channel length CL1 of between about 5 nm and about 180 nm, such as about 10 nm and a channel width CW1 of between about 8 nm and about 100 nm, such as about 30 nm. In an embodiment the nanostructures 701 are formed to have the same thicknesses as the original thicknesses of the second layers 207 such as, of between about 3 nm and about 15 nm, such as about 8 nm, although the etching processes may also be utilized to reduce the thicknesses.

In some embodiments, the wire release step may include an optional step for the partial removal of the material of the second layers 207 (e.g., by over etching) during removal of the first layers 205. As such, the thicknesses of the nanostructures 701 are formed to have reduced thicknesses as compared to the original thickness of the second layers 207. As such, the nanostructures 701 may have third thicknesses Th3 that are less than the thicknesses of the original second layers 207 (e.g., second thicknesses Th2). Furthermore, during such a partial removal, the top spacers 309, the inner spacers 403 may serve to protect adjacent material of the second layers 207 from being removed. As such, the thicknesses of the nanostructures 701 at distal end portions of the nanostructures 701 are protected during the wire release step and are not further reduced.

Figure 7C:
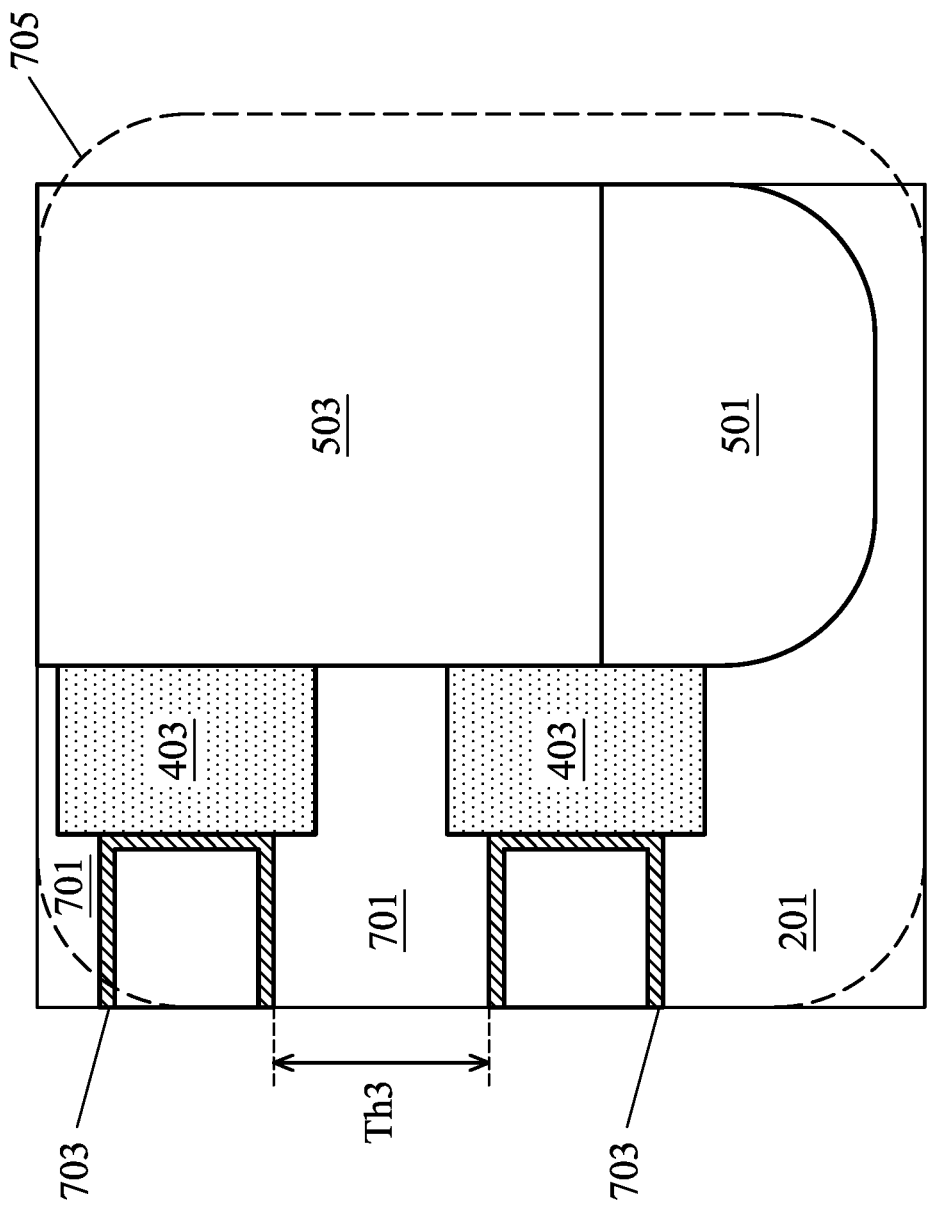

Additionally, although FIGS. 7A to 7C illustrate the formation of three of the nanostructures 701, any suitable number of the nanostructures 701 may be formed from the nanosheets provided in the multi-layer stack 203. For example, the multi-layer stack 203 may be formed to include any suitable number of the first layers 205 and any suitable number of the second layers 207. As such, a multi-layer stack 203 comprising fewer first layers 205 and fewer second layers 207, after removal of the first layers 205, forms one or two of the nanostructures 701. Whereas, a multi-layer stack 203 comprising many of the first layers 205 and many of the second layers 207, after removal of the first layers 205, forms four or more of the nanostructures 701.

FIGS. 7A-7B further illustrate the formation of the gate dielectric 703 over the nanostructures 701, according to some embodiments. In an embodiment the gate dielectric 703 comprises a high-k material (e.g., K>=9) such as $Ta_2O_5$, $Al_2O_3$, Hf oxides, Ta oxides, Ti oxides, Zr oxides, Al oxides, La oxides (e.g., $HfO_2$, HfSiO, HfSiON, HfTaO, HfTiO, HfZrO, LaO, ZrO, TiO), combinations of these, or the like, deposited through a process such as atomic layer deposition, chemical vapor deposition, or the like. In some embodiments, the gate dielectric 703 comprises a nitrogen doped oxide dielectric that is initially formed prior to forming a metal content high-K (e.g., K value>13) dielectric material. The gate dielectric 703 may be deposited to a thickness of between about 1 nm and about 3 nm, although any suitable material and thickness may be utilized. As illustrated, the gate dielectric 703 wraps around the nanostructures 701, thus forming channel regions between the source/drain regions 503.

Figures 8A, 8B:
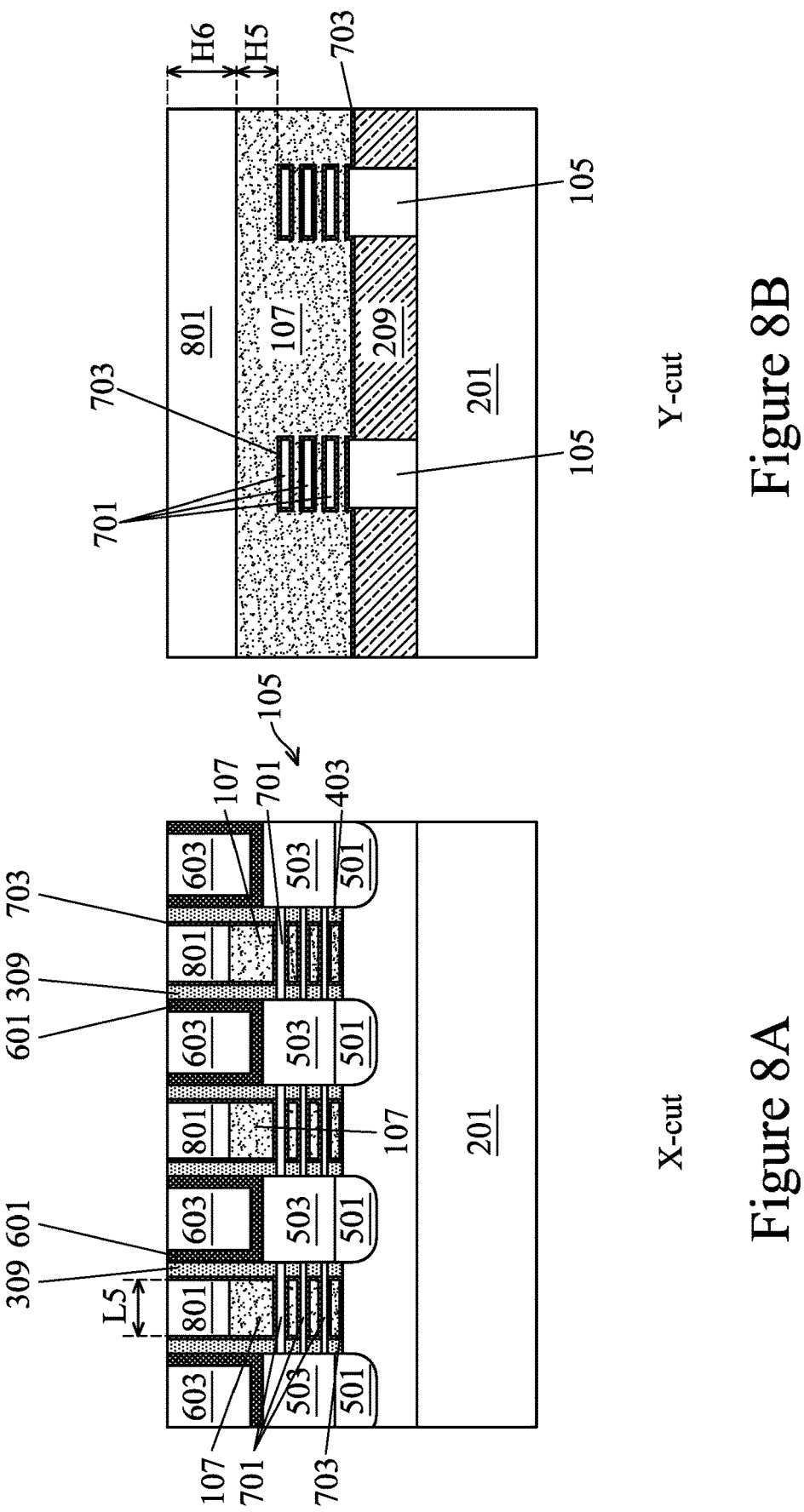
FIGS. 8A-8B illustrates cross-sectional views of forming gate electrodes and gate caps, in accordance with some embodiments.

FIGS. 8A and 8B illustrate cross-sectional views of forming gate electrodes 107 and gate caps 801, in accordance with some embodiments. Once the gate dielectric 703 has been formed, the gate electrodes 107 are formed to surround the nanostructures 701. In some embodiments, the gate electrodes 107 are formed using multiple layers, each layer deposited sequentially adjacent to each other using a highly conformal deposition process such as atomic layer deposition, although any suitable deposition process may be utilized. According to some embodiments, the gate electrodes 107 may comprise a capping layer, a barrier layer, an n-metal work function layer, a p-metal work function layer, and a fill material.

The capping layer may be formed adjacent to the gate dielectric 703 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as atomic layer deposition, chemical vapor deposition, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-metal work function layer may be formed adjacent to the barrier layer. In an embodiment the n-metal work function layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the first n-metal work function layer may be deposited utilizing an atomic layer deposition (ALD) process, CVD process, or the like. However, any suitable materials and processes may be utilized to form the n-metal work function layer.

The p-metal work function layer may be formed adjacent to the n-metal work function layer. In an embodiment, the first p-metal work function layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, TaN, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-metal work function layer may be deposited using a deposition process such as atomic layer deposition, chemical vapor deposition, or the like, although any suitable deposition process may be used.

Once the p-metal work function layer has been formed, the fill material is deposited to fill a remainder of the opening. In an embodiment the fill material may be a material such as tungsten, Al, Cu, AlCu, W, Ti, TiAlN, TiAl, Pt, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material may be utilized.

Once the openings left behind by the removal of the dummy gate electrode 303 have been filled, the materials of the gate electrode 107 and the gate dielectric 703 may be planarized in order to remove any material that is outside of the openings left behind by the removal of the dummy gate electrode 303. In a particular embodiment the removal may be performed using a planarization process such as chemical mechanical polishing, although any suitable planarization and removal process may be utilized. According to some embodiments, the gate electrodes may be formed to a fifth length L5 of between about 8 nm and about 30 nm. However, any suitable length may be used.

Once formed, the gate electrodes 107 may be recessed below the planarized surfaces of the interlayer dielectric layer 603. According to some embodiments, the gate electrodes 107 may be recessed using an etching process such as a wet etch, a dry etch, combinations, or the like. Once recessed, the height of the gate electrodes 107 above a topmost one of the nanostructure 701 is a fifth height H5. According to some embodiments, the fifth height H5 is between about 8 nm and about 30 nm. However, any suitable height may be used.

The gate caps 801 may be formed by initially depositing a dielectric material over the gate electrodes 107 to fill and/or overfill the recesses. In some embodiments, the gate caps 801 are formed using a dielectric material such as a silicon nitride (SiN), oxide (OX), silicon oxynitride (SiON), silicon oxycarbonitride (SiOCN), silicon carbonitride (SiCN), or the like. According to some embodiments, the gate caps 801 are formed using a metal oxide of materials such as zirconium (Zr), hafnium (Hf), aluminium (Al), or the like. Furthermore, the gate caps 801 may be formed using a suitable deposition process such as chemical vapor deposition (CVD), atomic layer deposition (ALD), physical vapor deposition (PVD), combinations of these, or the like. However, any suitable materials and deposition processes may be utilized. Once deposited, the gate caps 801 may be planarized with the interlayer dielectric layer 603 using a planarization process such as a chemical mechanical polishing process. Once planarized, the gate caps 801 have a sixth height H6 of between about 10 nm and about 30 nm. However, any suitable height may be used.

Figures 9A, 9B:
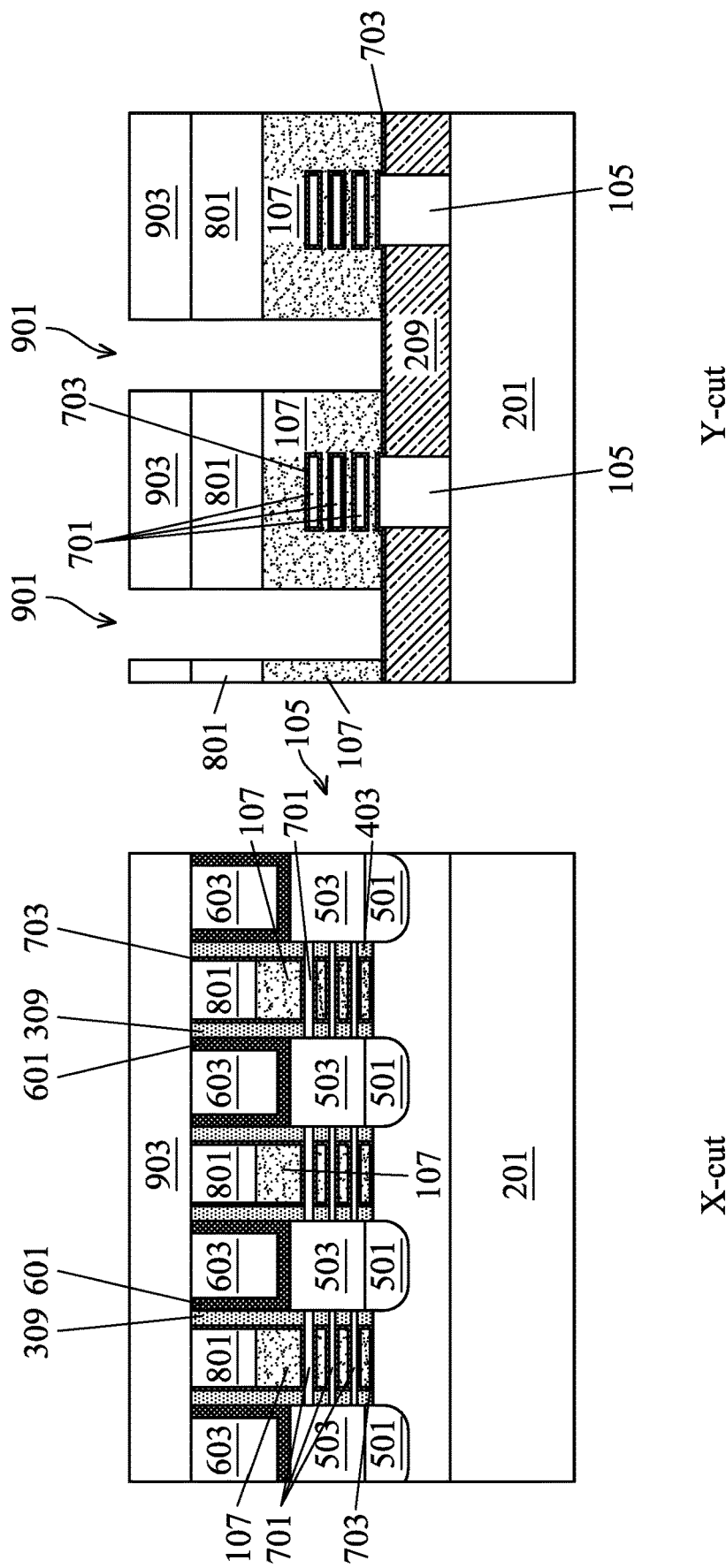
FIGS. 9A-9B illustrates cross-sectional views of forming openings in a cut-metal gate process, in accordance with some embodiments.

FIGS. 9A and 9B illustrate cross-sectional views of forming second openings 901 in a cut-metal gate process, in accordance with some embodiments. Once the gate caps 801 have been planarized with the interlayer dielectric layer 603, a masking layer 903 may be deposited over the planar surfaces of the gate caps 801, the interlayer dielectric layer 603, the contact etch stop layer 601, the top spacers 309, and the gate dielectric 703. Once deposited, the masking layer 903 is patterned to expose the underlying materials including the gate caps 801 and the interlayer dielectric layer 603 in desired locations of the cut-metal gate structures 109 that are to be formed.

Once patterned, the masking layer 903 is used as an etching mask to etch the underlying materials to form the second openings 901 (e.g., trenches, recesses, channels or the like). In the etching process, the materials of the gate caps 801 and the gate electrodes 107 are etched using an anisotropic etching process, and may stop on the top surface of the gate dielectric 703 or the top surface of the isolation regions 209. The second openings 901 may be formed between adjacent ones of the fins 105 and may be formed to cut through one or more gate electrodes 107. According to some embodiments, two of the second openings 901 are formed to cut through two adjacent ones of the gate electrodes 107 and are located on opposite sides of one of the fins 105, as shown in FIG. 1. According to some embodiments, the second openings 901 are located between top spacers 309 of two neighboring devices. Once the second openings 901 have been formed, the masking layer 903 is removed.

FIGS. 10A-10B illustrates cross-sectional views of forming cut-metal gate structures 109, in accordance with some embodiments. Once the second openings 901 have been formed, the cut-metal gate structures 109 are formed by initially depositing a dielectric material to fill and overfill the second openings 901. In accordance with some embodiments, the cut-metal gate structures 109 are formed using any dielectric material and deposition process suitable for forming the gate caps 801. In some embodiments, the dielectric material used to form the cut-metal gate structures 109 is the same as the dielectric material used to form the gate caps 801, although the dielectric materials may be different. For example, in embodiments where the gate caps 801 are formed using silicon nitride (SiN), the cut-metal gate structures 109 may also be formed using silicon nitride (SiN) in a deposition process such as Atomic Layer Deposition (ALD). However, any suitable dielectric materials and deposition processes may be used. According to some embodiments, the cut-metal gate structures 109 are formed to a third width W3 of between about 5 nm and about 50 nm, such as about 10 nm. However, any suitable widths may be used.

The cut-metal gate structures 109 divide the two gate electrodes 107 which are relatively long into a plurality of gate electrodes 107 which are relatively short and isolate the plurality of gate electrodes 107 from one another. Furthermore, the excess dielectric material of the cut-metal gate structures 109 outside of the second openings 901 may be retained and used as a masking layer in the Continuous Poly On Diffusion Edge (CPODE) process. As such, the cut-metal gate structures 109 are highlighted with a dashed line in FIG. 10B with the excess dielectric material remaining outside of the second openings 901.

Figures 11A, 11B:
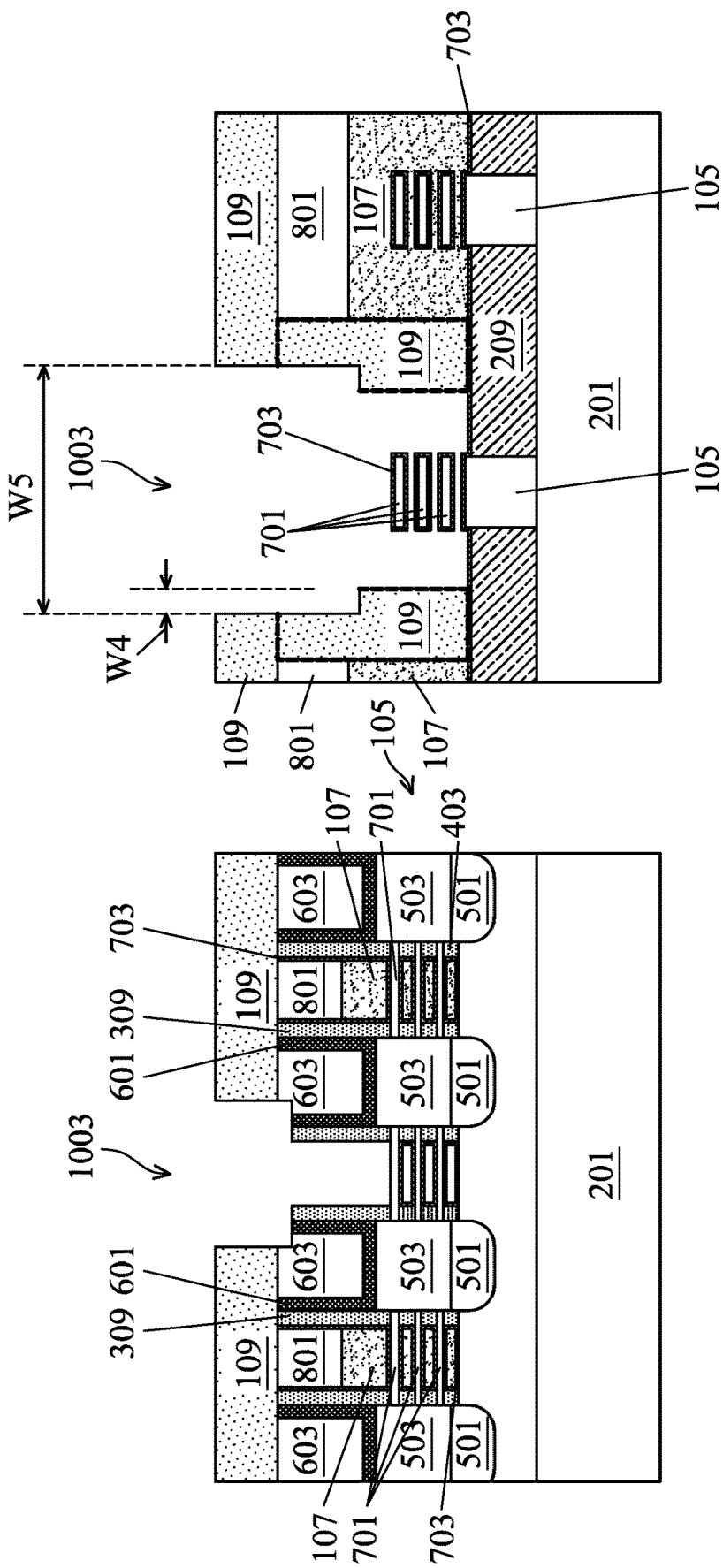
FIGS. 11A-11B illustrates cross-sectional views of forming an opening in an intermediate step in forming a Continuous Poly On Diffusion Edge (CPODE) structure, in accordance with some embodiments.

FIGS. 11A-11B illustrates cross-sectional views of forming a third opening 1003 in an initial step of forming a Continuous Poly On Diffusion Edge (CPODE) structure 111, in accordance with some embodiments. The CPODE structure 111 may also be referred to herein as an isolation structure, a cut-poly structure or a cut-PODE structure and is discussed in greater detail with the following figures.

Once the cut-metal gate structures 109 have been formed, a photo resist may be formed over the excess dielectric material and openings may be formed in the photo resist in a desired location of the CPODE structure 111 to be formed. The opening in the photo resist is formed to reveal a portion of the gate cap 801 between the two cut-metal gate structures 109. Furthermore, edge portions of the cut-metal gate structures 109 may also be exposed through the openings in the photo resist in order to provide some process margin for the CPODE structure 111. According to some embodiments, the width of the exposed edge portions may be a fourth width W4 of between about 3 nm and about 25 nm, such as about 5 nm. However, any suitable width may be used.

The photo resist is then used as an etching mask to etch the excess dielectric material, edge portions of the cut-metal gate structures 109, the gate cap 801, and the gate electrode 107, so that the third opening 1003 (e.g., trenches, recesses, channels or the like) is formed in the desired location of the CPODE structure 111. According to some embodiments, the etching process may stop on the gate dielectric 703. As a result, the gate dielectric 703 and the nanostructures 701 remain at the bottom of the third opening 1003. According to some embodiments, the etching process used to form the third opening 1003 may be an isotropic etching process (e.g., a wet etching process) using etchants that stop on the gate dielectric 703. However, other suitable etching process including anisotropic etching processes (e.g., a dry etching processes or reactive ion etching (RIE) processes), combinations of isotropic and anisotropic etches, or the like may also be used. According to some embodiments, the third opening 1003 is formed to a fifth width W5 of between about 20 nm and about 200 nm, such as about 70 nm. However, any suitable width may be used.

Figures 12A, 12B:
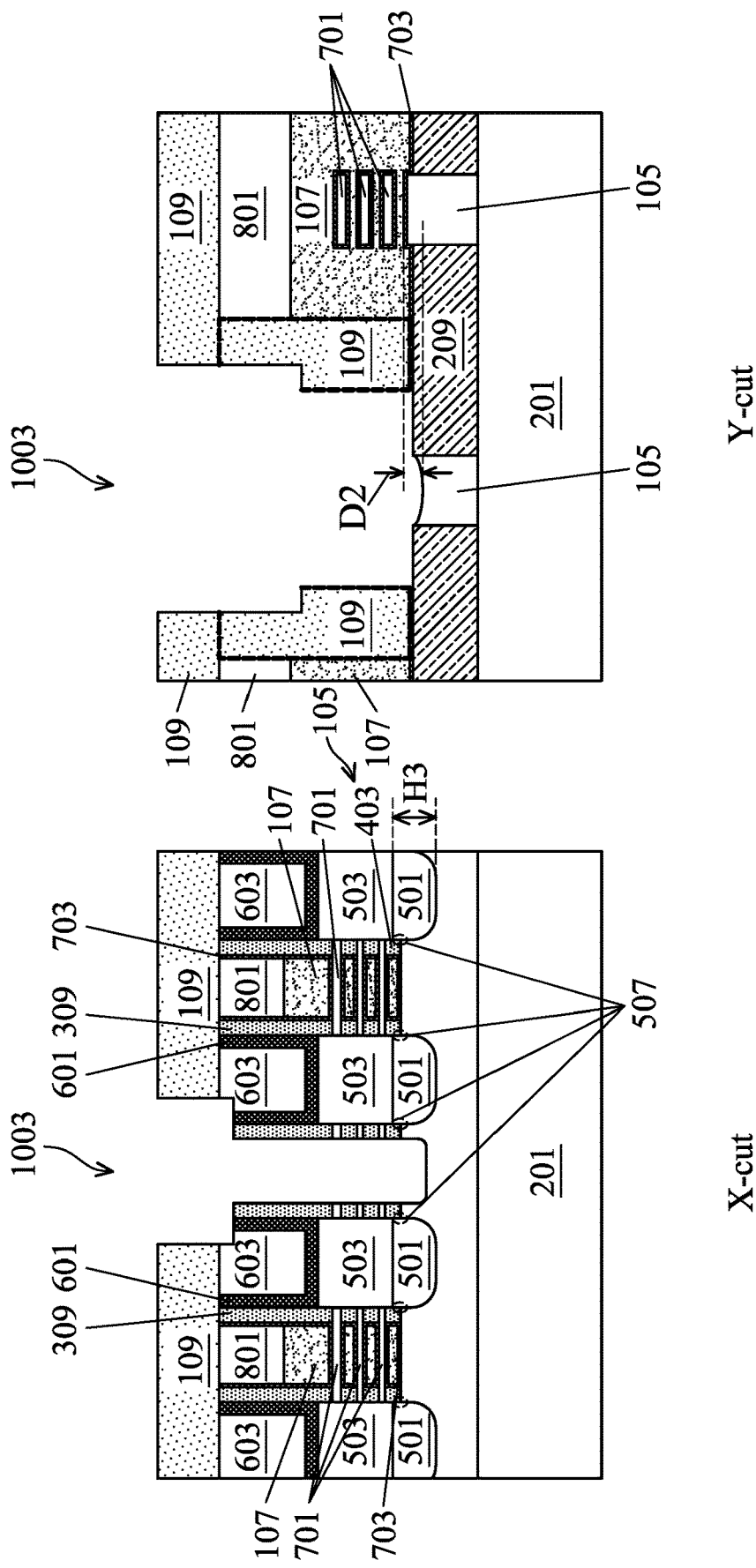
FIGS. 12A-12B illustrates cross-sectional views of extending the openings in a further intermediate step in forming the CPODE structure, in accordance with some embodiments.

FIGS. 12A-12B illustrates cross-sectional views of further etching processes in an intermediate step of performing the CPODE process, in accordance with some embodiments. Once the gate dielectric 703 has been exposed, another etching process is performed to remove the materials of the gate dielectric 703 within the third opening 1003 and to expose the nanostructures 701, the fin 105, and isolation regions 209 within the third opening 1003. According to some embodiments, a wet etch, a dry etch, combinations, or the like may be used to remove the material of the gate dielectric 703 without substantially removing the materials of the top spacers 309 and the inner spacers 403 along vertical sidewalls of the third opening 1003. However, any suitable etching process may be used.

Once the nanostructures 701 and a portion of the fin 105 protruding above the isolation regions 209 are exposed, a further etching process may be used to remove the materials of the nanostructures 701 and to form the recess within the fin 105. According to some embodiments, an etching process such as a wet etch, a dry etch, combinations, or the like may be used to remove these materials without substantially removing the materials of the top spacers 309, the inner spacers 403, and the isolation regions 209 the third opening 1003. According to an embodiment, the portion of the fin 105 protruding above the isolation regions 209 may be recessed a second depth D2 of between about 2 nm and about 20 nm, such as about 10 nm. However, any suitable depth may be used. According to some embodiments, a first ratio R1 of the second depth D2 to the third height H3 of the bottom spacer 501 may be between about 0.05:1 and about 1:1. Once the nanostructures 701 have been removed and the portion of the fin 105 protruding above the isolation regions 209 has been recessed, the photo resist may be removed, for example, via an ashing process.

FIGS. 13A-13B illustrates cross-sectional views of forming the CPODE structure 111, in accordance with some embodiments. The CPODE structure 111 may be formed by depositing a dielectric material to fill and/or overfill the third opening 1003. The CPODE structure 111 may be formed using a dielectric material such as a silicon nitride (SiN), oxide (OX), silicon oxynitride (SiON), silicon oxycarbonitride (SiOCN), silicon carbonitride (SiCN), or the like. According to some embodiments, the CPODE structure 111 is formed using a metal oxide of materials such as zirconium (Zr), hafnium (Hf), aluminum (Al), or the like. Furthermore, the CPODE structure 111 may be formed using a suitable deposition process such as chemical vapor deposition (CVD), atomic layer deposition (ALD), physical vapor deposition (PVD), combinations of these, or the like. The CPODE structure 111 may be formed using any of the dielectric materials and processes suitable for forming the cut-metal gate structures 109. According to some embodiments, the dielectric material used to form the CPODE structure 111 is the same dielectric material used to form the cut-metal gate structures 109, although the dielectric materials may also be different. For example, in an embodiment where the cut-metal gate structures 109 are formed using silicon nitride (SiN), the CPODE structure 111 may be formed using silicon nitride (SiN) via a deposition process such as, chemical vapor deposition (CVD), atomic layer deposition (ALD), sputtering, or the like.

Once formed, the excess material of the CPODE structure 111 outside of the third opening 1003 may be removed by a chemical mechanical planarization (CMP) process. According to some embodiments, the chemical mechanical planarization (CMP) process may be continued to planarize the surfaces of the CPODE structure 111 with the gate electrode 107 and the interlayer dielectric layer 603. Once planarized, the CPODE structure 111 over the fin 105 has a seventh height H7 of between about 55 nm and about 140 nm, such as about 70 nm. However, any suitable height may be used. The gate caps 801 have an eighth height H8 of between about 10 nm and about 30 nm, such as about 15 nm. However, any suitable height may be used. Furthermore, the cut-metal gate structures 109 have a ninth height H9 of between about 50 nm and about 120 nm, such as about 60 nm. However, any suitable height may be used.

Figures 14A, 14B:
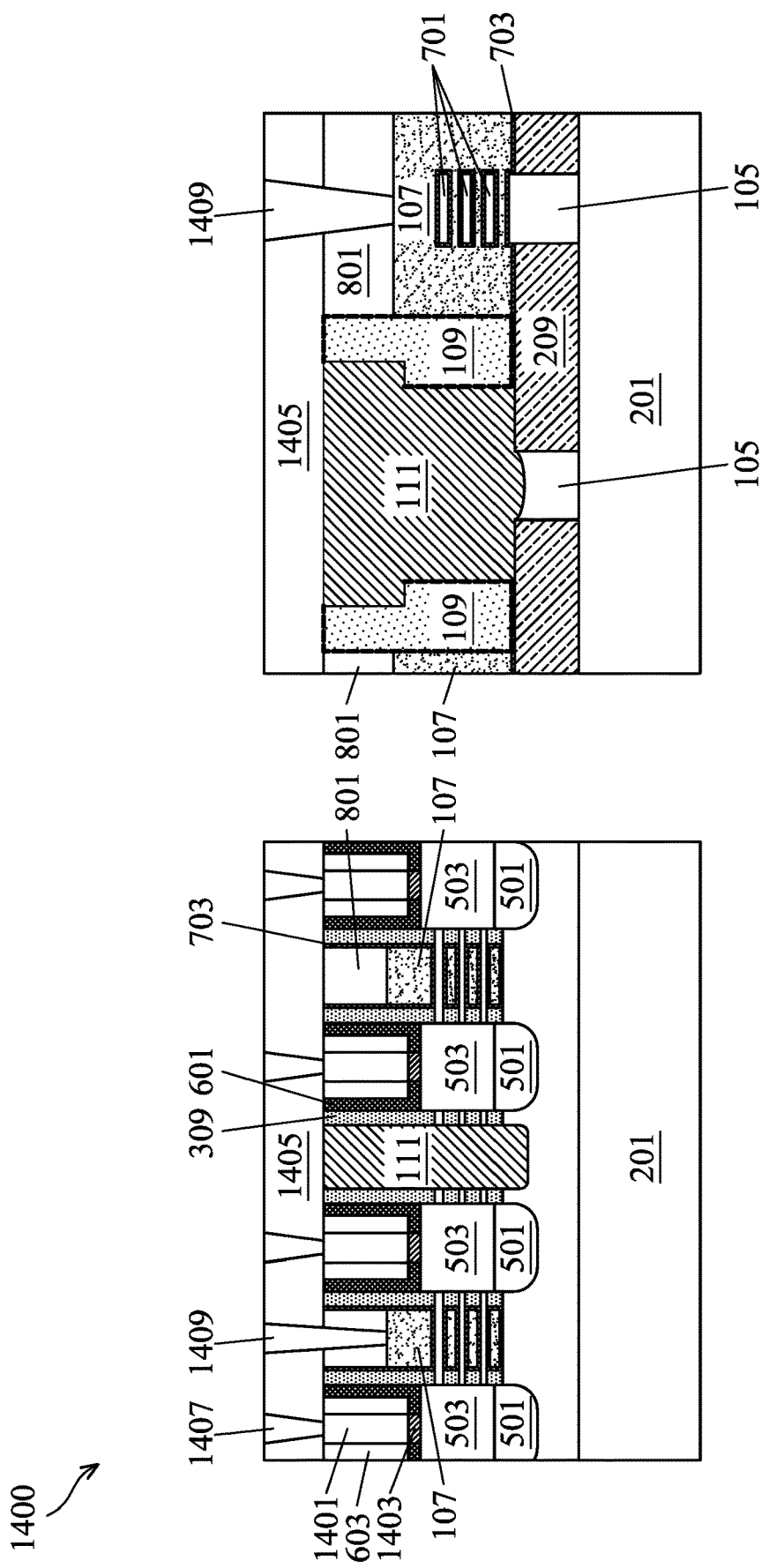
FIGS. 14A-14B illustrates cross-sectional views of forming source/drain contact plugs, in accordance with some embodiments.

FIGS. 14A and 14B illustrate cross-sectional views of forming source/drain contacts 1401 to the source/drain regions 503, in accordance with some embodiments. FIGS. 14A-14B further illustrate the formation of source/drain vias 1407 and gate vias 1409, in accordance with some embodiments.

Once the CPODE structure 111 has been formed, silicide contacts 1403 and source/drain contacts 1401 may be formed through the interlayer dielectric layer 603 to make electrical connection to the source/drain regions 503. In an embodiment the silicide contacts 1403 and the source/drain contacts 1401 may be formed by initially forming openings through the interlayer dielectric layer 603 in order to expose the source/drain regions 503. The openings may be formed using, e.g., a suitable photolithographic masking and etching process.

The silicide contacts 1403 may comprise titanium, nickel, cobalt, or erbium in order to reduce the Schottky barrier height of the source/drain contacts 1401. However, other metals, such as platinum, palladium, and the like, may also be used. The silicidation may be performed by blanket deposition of an appropriate metal layer, followed by an annealing step which causes the metal to react with the underlying exposed silicon of the source/drain regions 503. Un-reacted metal is then removed, such as with a selective etch process. The thickness of the silicide contacts 1403 may be between about 5 nm and about 50 nm. However, any suitable thickness may be used.

In an embodiment the source/drain contacts 1401 may be a conductive material such as Al, Cu, W, Co, Ti, Ta, Ru, TiN, TiAl, TiAlN, TaN, TaC, NiSi, CoSi, combinations of these, or the like, although any suitable material may be deposited into the openings using a deposition process such as sputtering, chemical vapor deposition, electroplating, electroless plating, or the like, to fill and/or overfill the openings. Once filled or overfilled, any deposited material outside of the openings may be removed using a planarization process such as chemical mechanical polishing (CMP). However, any suitable material and process of formation may be utilized.

Once the source/drain contacts 1401 have been formed, a second ILD layer 1405 may be formed by depositing a dielectric material over the planar surfaces of the interlayer dielectric layer 603, contact etch stop layer 601, the top spacers 309, the gate dielectric 703, the gate caps 801, the cut-metal gate structures 109 and the CPODE structure 111. The second ILD layer 1405 may be formed and planarized using any of the processes and materials suitable for forming the interlayer dielectric layer 603, as set forth above.

Once the second ILD layer 1405 has been formed, the source/drain vias 1407 may be formed through the second ILD layer 1405 to provide electrical connectivity to the source/drain regions 503. Furthermore, the gate vias 1409 may be formed through the second ILD layer 1405 and the gate caps 801 to provide electrical connectivity to the gate electrodes 107. Any suitable masking and etching process may be used to form the openings through the second ILD layer 1405 and through the dielectric capping layer 1104. In some embodiments, the openings for the source/drain vias 1407 and the openings for the gate vias 1409 may be patterned together using the same etching process. In other embodiments, the openings for the source/drain vias 1407 and the openings for the gate vias 1409 may be patterned in separate etching processes.

Once the openings have been formed for the source/drain vias 1407 and the gate vias 1409, conductive material, such as copper, may be deposited to fill and/or overfill the openings using a deposition process such as plating, chemical vapor deposition, sputtering, combinations of these, or the like. Excess material may then be removed using, for example, a planarization process such as chemical mechanical planarization, or the like.

According to the embodiments disclosed herein, the bottom spacers 501 are formed with the spacer interfaces 507 to the bottommost spacers of the inner spacers 403. The spacer interfaces 507 may have a length of between about 3 nm and about 15 nm. As such, the epitaxial growth of the source/drain regions 503 is ensured to be isolated from the substrate 201. If the length L1 of the spacer interfaces 507 is too short (e.g., less than 3 nm), the epitaxial growth of the source/drain regions 503 may not be formed in isolation from the substrate 201 when taking into consideration an etching depth variation for the source/drain regions 503. Furthermore if the length L1 of the spacer interfaces 507 is too long (e.g., greater than 15 nm) and is greater than the height H2 of the inner spacers 403, the bottom spacers 501 may hinder the current injection from the source/drain regions 507 into the nanostructures 701 during operation. As such, the production yield and/or device performance may be degraded.

By isolating the source/drain regions 503 from the substrate 201, the CPODE structure 111 may be formed with a shallow recess into the fin 105 without cutting through the isolation regions 209. According to some embodiments, the shallow recess may be recessed to the second depth D2 of between about 2 nm and about 20 nm. The first ratio R1 defines a ratio of the second depth D2 of the shallow recess used to form the CPODE structure 111 to the third height H3 of the bottom spacer 501. As such, the first ratio R1 can be used to determine the second depth D2 of the shallow recess to be used in forming the CPODE structure 111 for different technology nodes. According to some embodiments, the first ratio R1 may be between about 0.05:1 and about 1:1. By forming the CPODE structure 111 with the shallow recess with the first ratio R1 being roughly less than 1:1 allows for a large source/drain damage window and allows for accurate control of the gate height. With the large source/drain damage window, the CPODE structure 111 may be formed without damaging the source/drain regions 503 even when applied to N5 technologies and beyond. Furthermore, due to the accurate control of the gate height, little to no GH loss is experienced during formation of the CPODE structure 111. As such, forming the CPODE structure 111 using the second depth D2 for the shallow recess depth may be applied to N3 technologies and beyond. Furthermore, by forming the CPODE structure 111 using the first ratio R1 of at least 0.05:1 ensures efficient cut off of the nanostructures 701 for isolating the source/drain regions 503 from the substrate 201 during device operation. As such, production yield is increased and/or device performance is improved.

According to an embodiment, a method includes: forming a fin in a multilayer stack, the fin including a substrate and at least one first layer over the substrate; forming a gate electrode over the fin; etching an opening in the fin adjacent the gate electrode; forming a recess along a sidewall of the opening, the recess being formed in the at least one first layer; depositing an spacer material in the recess; forming a bottom spacer at a bottom of the opening, the bottom spacer forming a first interface with the spacer material; forming a source/drain region over the bottom spacer; and forming a dielectric structure through the gate electrode and into the substrate of the fin, a bottom of the dielectric structure being above a bottom of the bottom spacer. In an embodiment of the method, the spacer material within the recess has a thickness larger than the at least one first layer. In an embodiment of the method, the bottom spacer is formed to a height of between about 3 nm and about 30 nm. In an embodiment of the method, a length of the first interface is between about 3 nm and about 15 nm. In an embodiment, the method further includes forming a cut gate dielectric prior to the forming the dielectric structure. In an embodiment, the method further includes forming isolation regions on opposite sides of the fin, wherein the forming the gate electrode includes forming the gate electrode over the isolation regions and wherein a level of the bottom of the dielectric structure is between upper surfaces and bottom surfaces of the isolation regions. In an embodiment of the method, the level of the bottom of the dielectric structure extends into the substrate a distance of between about 2 nm and about 20 nm.

According to another embodiment, a method includes: etching a first opening through a gate electrode, a gate dielectric being exposed within the first opening; removing the gate dielectric within the first opening, wherein after the removing the gate dielectric a portion of a substrate, a stack of nanowires, and isolation regions are exposed; performing an etching process to remove the stack of nanowires within the first opening and to recess the portion of the substrate to a first level between an upper surface of the isolation regions and a bottom surface of the isolation regions; and depositing a dielectric material in the first opening, the dielectric material isolating a first portion of the gate electrode from a second portion of the gate electrode. In an embodiment of the method, the first level is at most 20 nm below the upper surface of the isolation regions. In an embodiment of the method, the first level is at least 2 nm below the upper surface of the isolation regions. In an embodiment, the method further includes forming a bottom spacer adjacent the substrate prior to the etching the first opening through the gate electrode; and forming a source/drain region over the bottom spacer. In an embodiment of the method, a bottom of the bottom spacer is below the first level. In an embodiment, the method further includes forming an inner spacer in a second stack of nanostructures, the inner spacer having a first interface with the bottom spacer. In an embodiment of the method, the first interface has a length of between about 3 nm and about 15 nm.

According to an embodiment, a semiconductor device includes: a stack of nanostructures over a first semiconductor fin, the first semiconductor fin being located over a substrate; an isolation region extending between the first semiconductor fin and a second semiconductor fin located over the substrate, the isolation region having a first surface facing away from the substrate, the first surface being located a first distance away from the substrate; a gate electrode surrounding each of the nanostructures within the stack of nanostructures; and a dielectric material adjacent to the gate electrode, the dielectric material having a first portion located adjacent to the second semiconductor fin, the first portion being located a second distance away from the substrate, the second distance being less than the first distance. In an embodiment of the semiconductor device, the second distance is at most 20 nm less than the first distance. In an embodiment, the semiconductor device further includes: a first source/drain region adjacent the stack of nanostructures; a first bottom spacer isolating the first source/drain region from the substrate; an inner spacer adjacent the first bottom spacer and separating the first bottom spacer from the dielectric material. In an embodiment of the semiconductor device, the inner spacer includes a first interface with the first bottom spacer, the first interface having a distance of between about 3 nm and about 15 nm. In an embodiment of the semiconductor device, the inner spacer has a first height of between about 5 nm and about 20 nm. In an embodiment of the semiconductor device, the first height is greater than a second height of one of the nanostructures within the stack of nano structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first nanostructure and a second nanostructure overlying a fin over a semiconductor substrate;
    an isolation region adjacent the fin;
    a first inner spacer located between the first nanostructure and the semiconductor substrate;
    a first spacer material in contact with the first inner spacer;
    a first source/drain region over an upper surface of the first spacer material, wherein the first source/drain region contacts both the first spacer material and the first inner spacer;
    a first gate electrode surrounding the first nanostructure and the second nanostructure;
    a second gate electrode adjacent the first gate electrode and having a longitudinal axis parallel to a longitudinal axis of the first gate electrode; and
    a dielectric structure extending through the second gate electrode and into the fin, a bottommost surface of the dielectric structure being above a bottom of the first spacer material, the dielectric structure comprising:
        a first layer having a bottom surface on a top surface of the isolation region; and
        a second layer adjacent the first layer, the second layer extending into the fin.

2. The semiconductor device of claim 1, wherein the first spacer material has a height of between about 3 nm and about 30 nm.

3. The semiconductor device of claim 1, wherein a length of an interface between the first spacer material and the first inner spacer is between about 3 nm and about 15 nm.

4. The semiconductor device of claim 1, wherein the dielectric structure extends into the fin between about 2 nm and about 20 nm.

5. The semiconductor device of claim 1, wherein the first spacer material comprises silicon oxide.

6. The semiconductor device of claim 1, wherein the first spacer material comprises silicon oxynitride.

7. The semiconductor device of claim 1, wherein the first inner spacer has a height of between about 5 nm and about 20 nm.

8. A semiconductor device comprising:
    a first bottom spacer separating a first source/drain region from a semiconductor substrate;
    a first inner spacer in contact with the first bottom spacer and the first source/drain region;
    a first nanostructure in contact with both the first inner spacer and the first source/drain region;
    a second nanostructure overlying the first nanostructure;
    a gate electrode surrounding both the first nanostructure and the second nanostructure, wherein the first inner spacer extends lower than an upper surface of the semiconductor substrate below the first nanostructure; and
    a dielectric structure adjacent to the first source/drain region, the first source/drain region being between the gate electrode and the dielectric structure, the dielectric structure having a bottommost surface further from the semiconductor substrate than the first bottom spacer.

9. The semiconductor device of claim 8, wherein the first inner spacer has a width of between about 2 nm and about 10 nm.

10. The semiconductor device of claim 9, wherein the first inner spacer has a height of between about 5 nm and about 20 nm.

11. The semiconductor device of claim 10, further comprising a second inner spacer separated from the first inner spacer by a first spacing of between about 3 nm and about 10 nm.

12. The semiconductor device of claim 8, wherein the first nanostructure has a first channel length of between about 5 nm and about 180 nm.

13. The semiconductor device of claim 8, wherein the first nanostructure has a first channel width of between about 8 nm and about 100 nm.

14. The semiconductor device of claim 8, wherein the first inner spacer is in physical contact with a first side and a second side of the first nanostructure, the first side being at an angle to the second side.

15. A semiconductor device comprising:
    a stack of nanostructures over a first semiconductor fin, the first semiconductor fin being located over a substrate;
    an isolation region extending between the first semiconductor fin and a second semiconductor fin located over the substrate, the isolation region having a first surface facing away from the substrate, the first surface being located a first distance away from the substrate;
    a first source/drain region adjacent the stack of nanostructures;
    a gate electrode surrounding each nanostructure within the stack of nanostructures;
    a dielectric structure adjacent to the gate electrode, the dielectric structure having a first bottommost surface and a first portion located adjacent to the second semiconductor fin, the first portion being located a second distance away from the substrate, the second distance being less than the first distance; and a first bottom spacer vertically separating the first source/drain region from the substrate, the first bottom spacer having a second bottom surface, the second bottom surface being lower than the first bottommost surface.

16. The semiconductor device of claim 15, wherein the second distance is at most 20 nm less than the first distance.

17. The semiconductor device of claim 15, further comprising:

an inner spacer adjacent the first bottom spacer and separating the first bottom spacer from the gate electrode.

18. The semiconductor device of claim 17, wherein the inner spacer has a first interface with the first bottom spacer, the first interface having a distance of between about 3nm and about 15 nm.

19. The semiconductor device of claim 18, wherein the inner spacer has a first height of between about 5 nm and about 20 nm.

20. The semiconductor device of claim 19, wherein the first height is greater than a second height of the gate electrode.

* * * * *